(12) United States Patent
Huang

(10) Patent No.: US 11,075,188 B2
(45) Date of Patent: Jul. 27, 2021

(54) PACKAGE STRUCTURE AND ASSEMBLY STRUCTURE

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/528,319

(22) Filed: Jul. 31, 2019

(65) Prior Publication Data

US 2021/0035949 A1    Feb. 4, 2021

(51) Int. Cl.
| | |
|---|---|
| H01L 23/48 | (2006.01) |
| H01L 25/065 | (2006.01) |
| H01L 23/00 | (2006.01) |
| H01L 23/31 | (2006.01) |
| H01L 23/522 | (2006.01) |
| H01L 25/00 | (2006.01) |
| H01L 23/538 | (2006.01) |
| H01L 21/56 | (2006.01) |

(52) U.S. Cl.
CPC .......... *H01L 25/0652* (2013.01); *H01L 21/56* (2013.01); *H01L 23/3107* (2013.01); *H01L 23/5226* (2013.01); *H01L 23/5383* (2013.01); *H01L 23/562* (2013.01); *H01L 24/14* (2013.01); *H01L 24/81* (2013.01); *H01L 25/50* (2013.01); *H01L 2924/3511* (2013.01)

(58) Field of Classification Search
CPC ............. H01L 23/3107; H01L 25/0652; H01L 23/5226; H01L 23/5283; H01L 23/562
See application file for complete search history.

(56) References Cited

U.S. PATENT DOCUMENTS

| | | | |
|---|---|---|---|
| 2011/0241215 A1* | 10/2011 | Sankman | H01L 21/50 257/773 |
| 2017/0117200 A1* | 4/2017 | Kim | H01L 21/485 |
| 2017/0170146 A1* | 6/2017 | Shen | H01L 23/49816 |
| 2017/0207172 A1* | 7/2017 | Lee | H01L 25/0657 |
| 2019/0096829 A1* | 3/2019 | Tang | H01L 24/20 |
| 2019/0115269 A1* | 4/2019 | Pan | H01L 25/03 |

* cited by examiner

*Primary Examiner* — Phuc T Dang
(74) *Attorney, Agent, or Firm* — Foley & Lardner LLP

(57) ABSTRACT

A package structure includes a plurality of lower elements, a reinforcement structure and an encapsulant. The lower elements are disposed side by side. The reinforcement structure surrounds the lower elements. The encapsulant covers the lower elements and the reinforcement structure. The electrical connectors of the lower elements are exposed from the encapsulant.

22 Claims, 20 Drawing Sheets

PACKAGE STRUCTURE AND ASSEMBLY STRUCTURE

BACKGROUND

1. Field of the Disclosure

The present disclosure relates to a package structure, an assembly structure, and a manufacturing method, and to a package structure including a reinforcement structure, an assembly structure including the same, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease, which may adversely affect a yield of the semiconductor package (s).

SUMMARY

In some embodiments, a package structure includes a first lower element, a second lower element, a reinforcement structure and an encapsulant. The first lower element has a first surface and a second surface opposite to the first surface, and includes a plurality of first electrical connectors disposed adjacent to the first surface thereof. The second lower element is disposed side by side with the first lower element. The second lower element has a first surface and a second surface opposite to the first surface, and includes a plurality of second electrical connectors disposed adjacent to the first surface thereof. The reinforcement structure surrounds the first lower element and the second lower element. The encapsulant covers the first lower element, the second lower element and the reinforcement structure. The encapsulant has a first surface and a second surface opposite to the first surface. The first electrical connectors of the first lower element and the second electrical connectors of the second lower element are exposed from the first surface of the encapsulant.

In some embodiments, an assembly structure includes a package structure, a conductive structure and at least one upper element. The package structure includes a plurality of lower elements, a reinforcement structure and an encapsulant. The lower elements are disposed side by side. The reinforcement structure surrounds the lower elements. The encapsulant covers the lower elements and the reinforcement structure. The encapsulant has a first surface and a second surface opposite to the first surface. A plurality of electrical connectors of the lower elements are exposed from the first surface of the encapsulant. The conductive structure is disposed adjacent to the first surface of the encapsulant, and electrically connected to the electrical connectors of the lower elements. The conductive structure includes at least one dielectric layer and at least one circuit layer in contact with the dielectric layer. The upper element is electrically connected to the conductive structure.

In some embodiments, a manufacturing method includes: (a) providing a carrier; (b) forming a reinforcement structure on the carrier; (c) disposing a plurality of lower elements side by side on the carrier, wherein each of the lower elements includes a plurality of electrical connectors, and the lower elements are surrounded by the reinforcement structure; and (d) forming an encapsulant to cover the lower elements and the reinforcement structure, wherein the electrical connectors of the lower elements are exposed from a first surface of the encapsulant.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
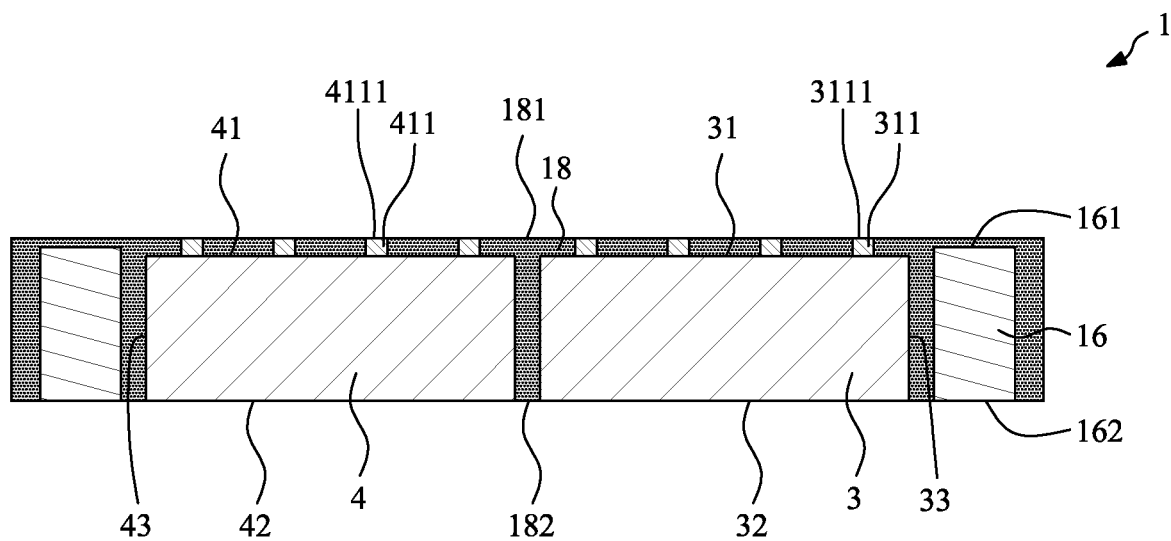
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved warpage resistance. In some embodiments, an assembly structure includes such package structure so as to improve a yield thereof. At least some embodiments of the present disclosure further provide for techniques for manufacturing the package structure and the assembly structure.

Figure 2:
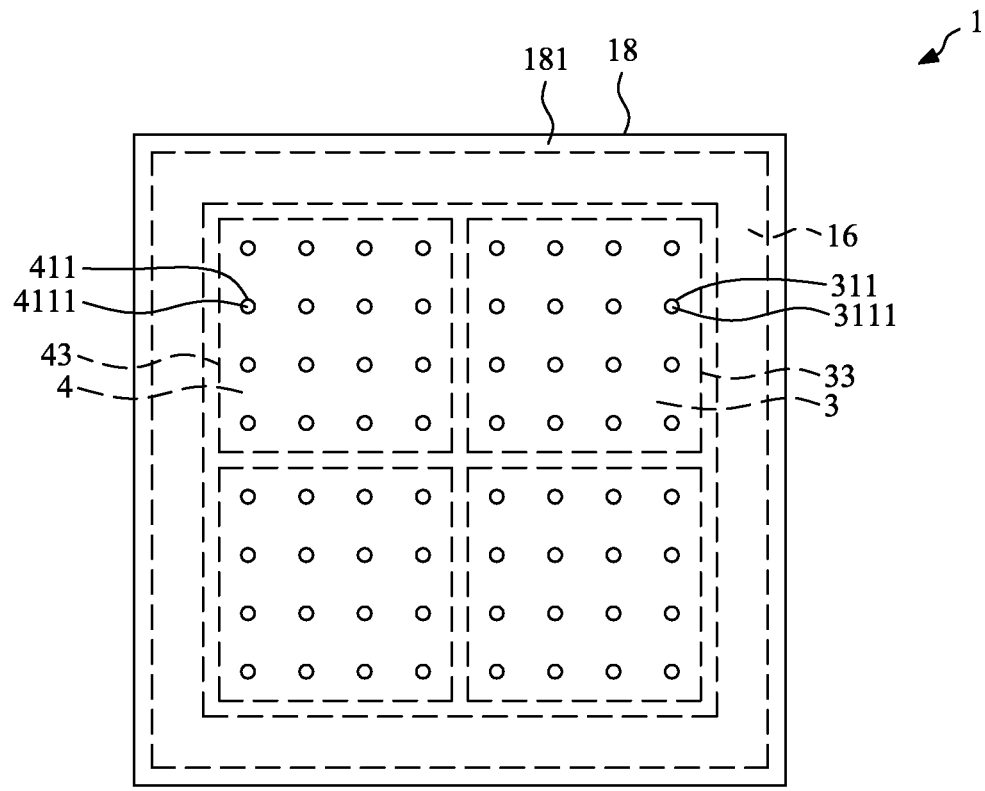
FIG. 2 illustrates a top view of the package structure of FIG. 1.

FIG. 1 illustrates a cross-sectional view of a package structure 1 according to some embodiments of the present disclosure. FIG. 2 illustrates a top view of the package structure 1 of FIG. 1. The package structure 1 includes a first lower element 3, a second lower element 4, a reinforcement structure 16 and an encapsulant 18.

The first lower element 3 has a first surface 31, a second surface 32 opposite to the first surface, and a periphery lateral surface 33 extending between the first surface 31 and the second surface 32. The first lower element 3 may further include a plurality of first electrical connectors 311 disposed adjacent to the first surface 31 of the first lower element 3. The first electrical connectors 311 may be pillars or bumps, and may be disposed on the first surface 31 of the first lower element 3. In some embodiments, the first electrical connectors 311 may be conductive pads in proximity to, or embedded in and exposed at the first surface 31 of the first lower element 3. Each of the first electrical connectors 311 has a top surface 3111. In some embodiments, the first lower element 3 may be a substrate (such as a core substrate or a coreless substrate), a semiconductor chip or a semiconductor die. In some embodiments, the first lower element 3 may be a substrate, and a material of such substrate may include epoxy type FR5, FR4, bismaleimidetriazine (BT), silicon, print circuit board (PCB) material, glass or ceramic.

The second lower element 4 is disposed side by side with the first lower element 3, and they may be disposed at the same elevation. The second lower element 4 has a first surface 41, a second surface 42 opposite to the first surface 41, and a periphery lateral surface 43 extending between the first surface 41 and the second surface 42. The second lower element 4 may further include a plurality of second electrical connectors 411 disposed adjacent to the first surface 41 of the second lower element 4. The second electrical connectors 411 may be pillars or bumps, and may be disposed on the first surface 41 of the second lower element 4. In some embodiments, the second electrical connectors 411 may be conductive pads in proximity to, or embedded in and exposed at the first surface 41 of the second lower element 4. Each of the second electrical connectors 411 has a top surface 4111. In some embodiments, the second lower element 4 may be a substrate (such as a core substrate or a coreless substrate), a semiconductor chip or a semiconductor die. In addition, the second lower element 4 and the first lower element 3 may both be substrates, semiconductor chips or semiconductor dice. However, in other embodiment, one of the second lower element 4 and the first lower element 3 may be a substrate, and the other of the second lower element 4 and the first lower element 3 may be a semiconductor chip or a semiconductor die. That is, a function and a size of the second lower element 4 and the first lower element 3 may be same as or different from each other.

The reinforcement structure 16 surrounds the first lower element 3 and the second lower element 4. A material of the reinforcement structure 16 includes metal such as copper. The reinforcement structure 16 is a wall structure, and a thickness of the reinforcement structure 16 may be less than a sum of a thickness of the first lower element 3 and a thickness of the first electrical connector 311. Further, the reinforcement structure 16 is electrically isolated from the first lower element 3 and the second lower element 4. Thus, the reinforcement structure 16 may not have electrical function. The reinforcement structure 16 has a top surface 161 and a bottom surface 162 opposite to the top surface 161. As shown in FIG. 2, the reinforcement structure 16 is in a continuous ring shape from a top view. That is, the reinforcement structure 16 is a monolithic structure, and the first lower element 3 and the second lower element 4 are disposed within a space defined by the reinforcement structure 16.

The encapsulant 18 covers the first lower element 3, the second lower element 4 and the reinforcement structure 16. A material of the encapsulant 18 may be a molding compound with or without fillers. The encapsulant 18 has a first surface 181 (e.g., a top surface) and a second surface 182 (e.g., a bottom surface) opposite to the first surface 181. As shown in FIG. 1, the first electrical connectors 311 of the first lower element 3 and the second electrical connectors 411 of the second lower element 4 are exposed from the first surface 181 of the encapsulant 18 for external connection. In some embodiments, the top surfaces 3111 of the first electrical connectors 311 of the first lower element 3 and the top surfaces 4111 of the second electrical connectors 411 of the second lower element 4 are substantially coplanar with the first surface 181 of the encapsulant 18. Further, the encapsulant 18 covers the top surface 161 of the reinforcement structure 16. Thus, the reinforcement structure 16 may not be used for external connection. In addition, the bottom surface 162 of the reinforcement structure 16, the bottom surface 182 of the encapsulant, the second surface 32 of first lower element 3 and the second surface 42 of second lower element 4 are substantially coplanar with each other. As shown in FIG. 1, a portion of the encapsulant 18 is disposed between the periphery lateral surface 33 of the first lower element 3 and the periphery lateral surface 43 of the second lower element 4.

As shown in the embodiment illustrated in FIG. 1 and FIG. 2, the mismatch of coefficient of thermal expansion (CTE) between the encapsulant 18 and the lower elements (e.g., the first lower element 3 and the second lower element 4) may result in severe warpage to the package structure 1 if the first lower element 3 and the second lower element 4 are a single element. However, the first lower element 3 and the second lower element 4 are separated; thus, the warpage of the individual lower elements (e.g., the first lower element 3 and the second lower element 4) will not be accumulated. Further, the reinforcement structure 16 is a rigid structure such as a metal structure, so as to effectively suppress the warpage of the package structure 1. In addition, the lower elements (e.g., the first lower element 3 and the second lower element 4) may be known good elements. Thus, the yield of the package structure 1 is improved.

Figure 3:
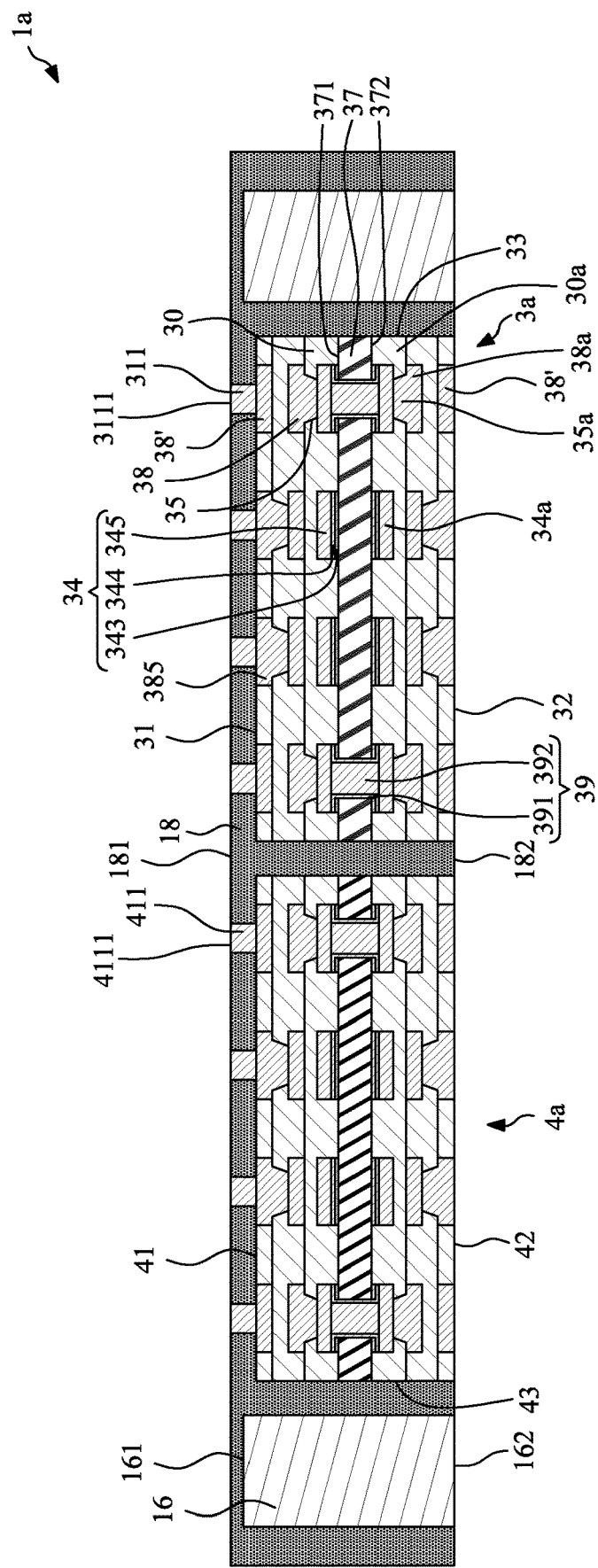
FIG. 3 illustrates a cross-sectional view of an example of a package structure according to some embodiments of the present disclosure.

FIG. 3 illustrates a cross-sectional view of an example of a package structure 1a according to some embodiments of the present disclosure. The package structure 1a of FIG. 3 is an example of the package structure 1 of FIG. 1. As shown in FIG. 3, both the first lower element 3a and the second lower element 4a are substrates, and the first lower element 3a is substantially same as the second lower element 4a. The first lower element 3a includes at least one dielectric layer (including, for example, at least one upper dielectric layer 30 and at least one lower dielectric layer 30a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the upper dielectric layer 30 and the lower dielectric layer 30a), and at least one inner via (including, for example, a plurality of upper interconnection vias 35 and a plurality of lower interconnection vias 35a). In some embodiments, the first lower element 3a may be similar to a core substrate that further includes a core portion 37. As shown in FIG. 3, the first lower element 3a has a top surface 31 and a bottom surface 32 opposite to the top surface 31.

The core portion 37 has a top surface 371 and a bottom surface 372 opposite to the top surface 371. An interconnection via 39 extends through the core portion 37 for vertical connection. In some embodiments, each interconnection via 39 includes a base metallic layer 391 and an insulation material 392. The base metallic layer 391 is disposed or formed on a side wall of a through hole of the core portion 37, and defines a central through hole. The insulation material 392 fills the central through hole defined by the base metallic layer 391. In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer of the first lower circuit layer 34a may be formed integrally and concurrently as a monolithic or one-piece structure.

The upper dielectric layers 30 are disposed on or disposed adjacent to the top surface 371 of the core portion 37, and the lower dielectric layers 30a are disposed on or disposed adjacent to the bottom surface 372 of the core portion 37. The upper dielectric layers 30 and the lower dielectric layers 30a may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

In some embodiments, the first upper circuit layer 34 is formed or disposed on the top surface 371 of the core portion 37, and covered by the upper dielectric layer 30. The first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer.

The second upper circuit layer 38 is formed or disposed on an upper dielectric layer 30, and is electrically connected to the first upper circuit layer 34 through the upper interconnection vias 35. In some embodiments, the second upper circuit layer 38 and the upper interconnection vias 35 are formed integrally as a monolithic or one-piece structure. In addition, the second upper circuit layer 38' is formed or disposed on an upper dielectric layer 30, and is electrically connected to the second upper circuit layer 38 through the upper interconnection vias 35. As shown in FIG. 3, the second upper circuit layer 38' is the topmost circuit layer of the first lower element 3a, and may include a plurality of traces and a plurality of pads 385. However, in other embodiments, the second upper circuit layer 38' may solely include the pads 385. The first electrical connectors 311 are formed or disposed on the pads 385.

The lower dielectric layer 30a, the first lower circuit layer 34a, the second lower circuit layers 38a, 38a' and the lower interconnection vias 35a are same as or similar to the upper dielectric layer 30, the first upper circuit layer 34, the second upper circuit layers 38, 38' and the upper interconnection vias 35, respectively.

Figure 4:
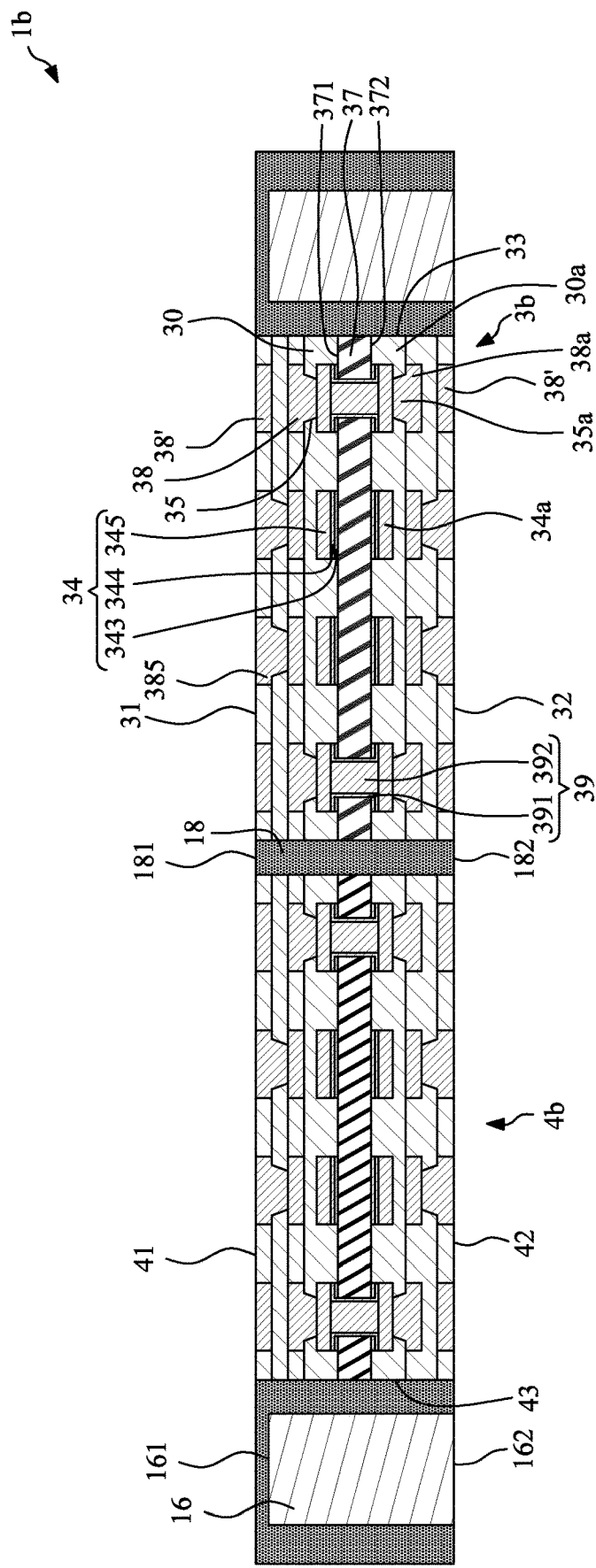
FIG. 4 illustrates a cross-sectional view of an example of a package structure according to some embodiments of the present disclosure.

FIG. 4 illustrates a cross-sectional view of an example of a package structure 1b according to some embodiments of the present disclosure. The package structure 1b of FIG. 4 is an example of the package structure 1 of FIG. 1. The package structure 1b of FIG. 4 is similar to the package structure 1a of FIG. 3 except for the structures of the first lower element 3b and the second lower element 4b. As shown in FIG. 4, the first electrical connectors 311 and the second electrical connectors 411 are omitted. Thus, taking the first lower element 3b for example, the pads 385 of the second upper circuit layer 38' are exposed from the top surface 31 of the first lower element 3b. The top surfaces of the pads 385 of the second upper circuit layer 38' may be substantially coplanar with the top surface 31 of the first lower element 3b and the first surface 181 of the encapsulant 18. Therefore, the pads 385 of the second upper circuit layer 38' are used as the electrical connectors.

Figure 5:
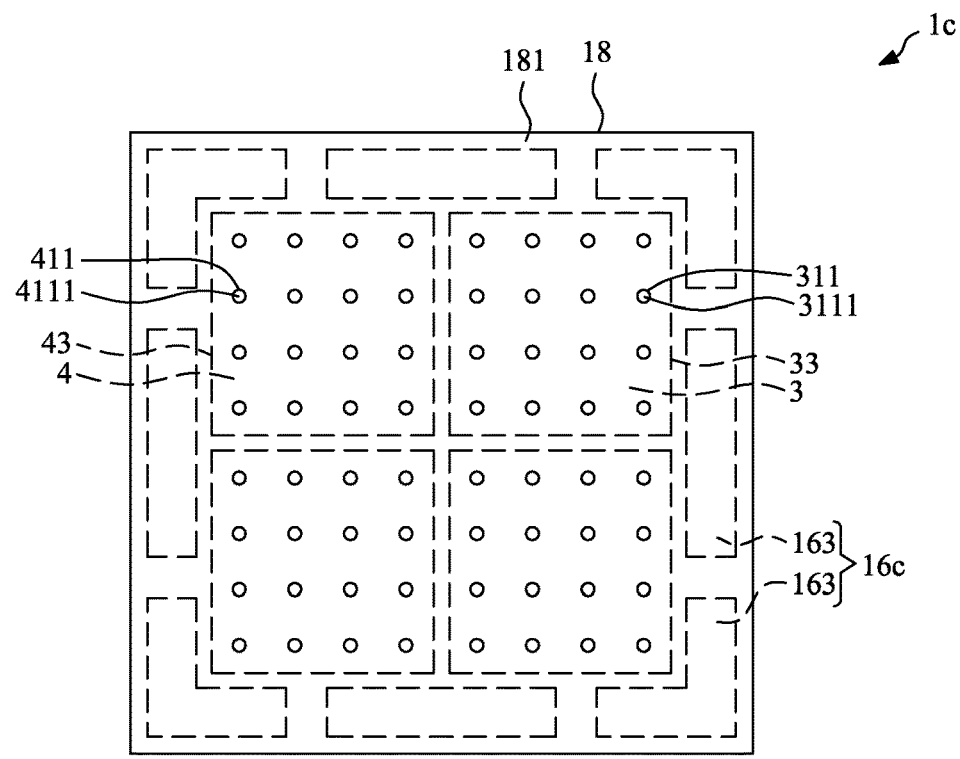
FIG. 5 illustrates a top view of a package structure according to some embodiments of the present disclosure.

FIG. 5 illustrates a top view of a package structure 1c according to some embodiments of the present disclosure. The package structure 1c of FIG. 5 is similar to the package structure 1 of FIG. 2 except for a structure of the reinforcement structure 16c. As shown in FIG. 5, the reinforcement structure 16c includes a plurality of wall segments 163 spaced apart from each other. That is, the reinforcement structure 16c is a discontinuous structure, and is not a complete ring from a top view.

Figure 6:
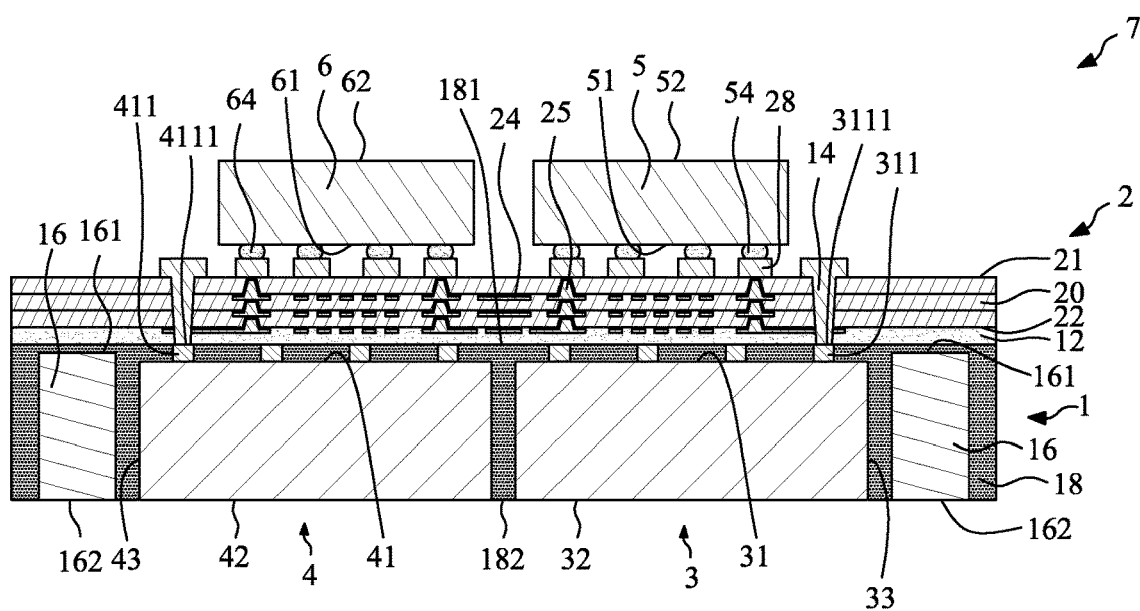
FIG. 6 illustrates a cross-sectional view of an assembly structure according to some embodiments of the present disclosure.

FIG. 6 illustrates a cross-sectional view of an assembly structure 7 according to some embodiments of the present disclosure. The assembly structure 7 may be a semiconductor package, and may include a package structure 1, a conductive structure 2, an intermediate layer 12, at least one upper through via 14 and at least one upper element (including, for example, a first upper element 5 and a second upper element 6). The package structure 1 of FIG. 6 may be same as or similar to the package structure 1 of FIG. 1.

The conductive structure 2 is disposed adjacent to the first surface 181 of the encapsulant 18, and electrically connected to the electrical connectors 311, 411 of the lower elements 3, 4. The conductive structure 2 includes at least one dielectric layer 20, at least one circuit layer (including, for example, at least one circuit layer 24 and a top circuit layer 28) in contact with the dielectric layer 20, and a plurality of inner vias 25. In some embodiments, the conductive structure 2 may be similar to a coreless substrate. The conductive structure 2 has a top surface 21 and a bottom surface 22 opposite to the top surface 21. The dielectric layers 20 are stacked on one another. In some embodiments, a material of the dielectric layers 20 is transparent, and can be seen through by human eyes or machine. The dielectric layers 20 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

The circuit layers 24 may be fan-out circuit layers or redistribution layers (RDLs), and an L/S of the circuit layers 24 may be less than or equal to about 2 μm/about 2 μm, or less than or equal to about 1.8 μm/about 1.8 μm. In some embodiments, the circuit layer 24 is embedded in the corresponding dielectric layer 20. In some embodiments, the circuit layer 24 may include a seed layer and a conductive metallic material disposed on the seed layer. The top circuit layer 28 is disposed on and protrudes from the top surface 21 of the conductive structure 2.

The inner vias 25 are disposed between two adjacent circuit layers 24 and the top circuit layer 28 for electrically connecting the two circuit layers 24, or electrically connecting the circuit layer 24 and the top circuit layer 28. In some embodiments, each inner via 25 may include a seed layer and a conductive metallic material disposed on the seed layer. In some embodiments, each inner via 25 and the corresponding circuit layer 24 may be formed integrally as a monolithic or one-piece structure. Each inner via 25 tapers upwardly along a direction from the bottom surface 22 towards the top surface 21 of the conductive structure 2.

A thickness of each of the dielectric layers 20 of the conductive structure 2 is less than or equal to about 40%, less than or equal to about 35%, less than or equal to about 30% of a thickness of each of the dielectric layers (e.g., the first upper dielectric layer 30 and the first lower dielectric layer 30a of the first lower element 3a (FIG. 3). An L/S of the circuit layer (e.g., the first upper circuit layer 34) of the first lower element 3a (FIG. 3) may be greater than an L/S of the circuit layer 24 of the conductive structure 2. For example, the L/S of the circuit layer (e.g., the first upper circuit layer 34) of the first lower element 3a (FIG. 3) may be greater than or equal to about five times the L/S of the circuit layer 24 of the conductive structure 2.

The intermediate layer 12 is interposed or disposed between the conductive structure 2 and the package structure 1. The intermediate layer 12 may bond the conductive structure 2 and the package structure 1 together. That is, the intermediate layer 12 adheres to the bottom surface 22 of the conductive structure 2 and the top surface of the package structure 1 (e.g., the first surface 181 of the encapsulant 18). Thus, the conductive structure 2 is attached to the first surface 181 of the encapsulant 18 through the intermediate layer 12. In some embodiments, the intermediate layer 12 may be an adhesion layer that is cured from an adhesive material (e.g., includes a cured adhesive material such as an adhesive polymeric material) or an underfill. The bottommost circuit layer 24 of the conductive structure 2 is embedded in the intermediate layer 12. In addition, a material of the intermediate layer 12 may include Ajinomoto build-up film (ABF).

The upper through via 14 extends through the conductive structure 2 and the intermediate layer 12, and is electrically connected to the lower elements (e.g., the first lower element 3 and the second lower element 4) of the package structure 1. As shown in FIG. 6, the upper through vias 14 terminate at or on, and contact the first electrical connectors 311 and the second electrical connectors 411. Further, the upper through via 14 tapers downwardly. Thus, a tapering direction of the inner via 25 of the conductive structure 2 is different from a tapering direction of the upper through via 14. In some embodiments, the upper through via 14 is a monolithic structure or a one-piece structure having a homogeneous material composition, and a peripheral surface of the upper through via 14 is a substantially continuous surface without boundaries. The upper through via 14 and the top circuit layer 28 may be formed integrally as a monolithic or one-piece structure. It is noted that the reinforcement structure 16 may not contact or electrically connect the conductive structure 2. That is, the reinforcement structure 16 may be electrically isolated from the conductive structure 2.

The first upper element 5 may be a semiconductor chip, and has a first surface 51 (e.g., an active surface) and a second surface 52 (e.g., a backside surface) opposite to the first surface 51. The first surface 51 of the first upper element 5 is electrically connected and bonded to the top circuit layer 28 of the conductive structure 2 through the first connecting elements 54 (e.g., solder bumps or other conductive bumps). The second upper element 6 may be a semiconductor chip, and has a first surface 61 (e.g., an active surface) and a second surface 62 (e.g., a backside surface) opposite to the first surface 61. The first surface 61 of the second upper element 6 is electrically connected and bonded to the top circuit layer 28 of the conductive structure 2 through the second connecting elements 64 (e.g., solder bumps or other conductive bumps). In other words, the first upper element 5 and the second upper element 6 are electrically connected to the conductive structure 2 by flip-chip bonding. In some embodiments, each of the first upper element 5 and the second upper element 6 may be a substrate, a semiconductor chip or a semiconductor die.

As shown in the embodiment illustrated in FIG. 6, the assembly structure 7 is a combination of the conductive structure 2 and the package structure 1, in which the circuit layers 24 of the conductive structure 2 have fine pitch, high yield and low thickness; and the circuit layers (e.g., the first upper circuit layer 34, the second upper circuit layers 38, 38', the first lower circuit layer 34a and the second lower circuit layers 38a, 38a') of the lower elements 3, 4 of the package structure 1 have low manufacturing cost. Thus, the assembly structure 7 has an advantageous compromise of yield and manufacturing cost, and the assembly structure 7 has a relatively low thickness. In addition, the warpage of the conductive structure 2 and the warpage of the package structure 1 are separated and will not influence each other. That is, the warpage of the package structure 1 will not be accumulated onto the warpage of the conductive structure 2. Thus, the yield of the assembly structure 7 may be further improved.

Figure 7:
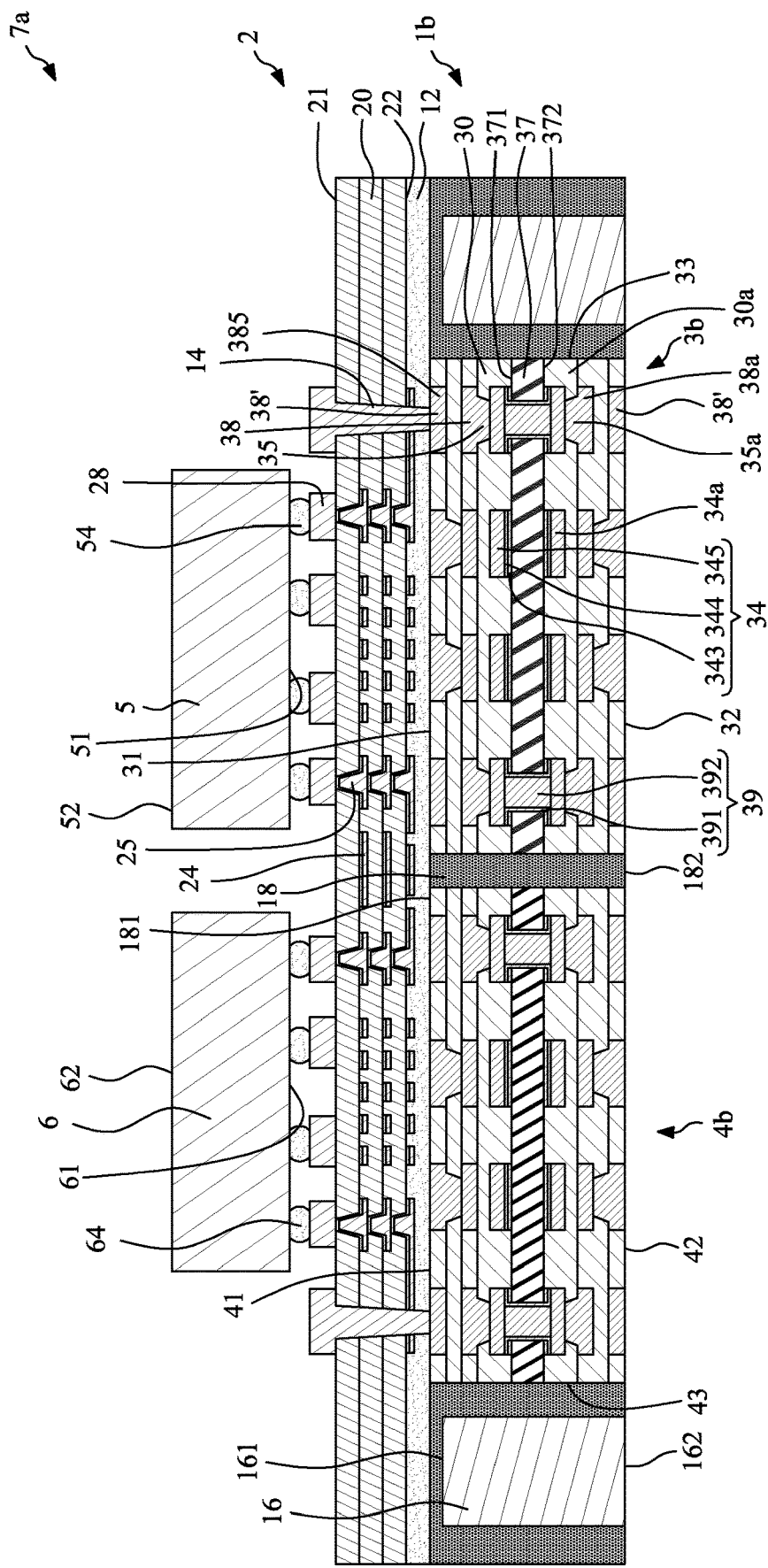
FIG. 7 illustrates a cross-sectional view of an assembly structure according to some embodiments of the present disclosure.

FIG. 7 illustrates a cross-sectional view of an assembly structure 7a according to some embodiments of the present disclosure. The assembly structure 7a of FIG. 7 is similar to the assembly structure 7 of FIG. 6 except that the package structure 1 of FIG. 6 is replaced by the package structure 1b of FIG. 4. Therefore, the upper through vias 14 terminate at or on, and contact the pads 385 (which are used as electrical connectors) of the second upper circuit layer 38'. In addition, the intermediate layer 12 adheres to the bottom surface 22 of the conductive structure 2 and the top surface of the package structure 1b (e.g., the first surface 181 of the encapsulant 18, the first surface 31 of the first lower element 3 and the first surface 41 of the second lower element 4).

Figure 8:
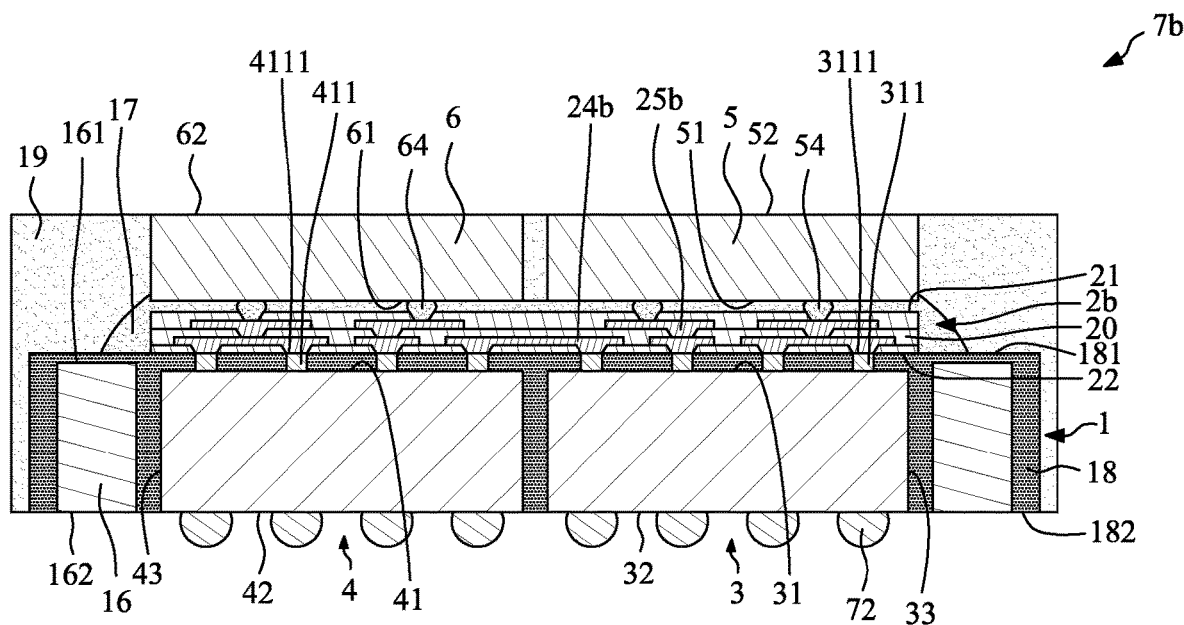
FIG. 8 illustrates a cross-sectional view of an assembly structure according to some embodiments of the present disclosure.

FIG. 8 illustrates a cross-sectional view of an assembly structure 7b according to some embodiments of the present disclosure. The assembly structure 7b of FIG. 8 is similar to the assembly structure 7 of FIG. 6 except that the conductive structure 2 of FIG. 6 is replaced by the conductive structure 2b of FIG. 8, and an underfill 17, a package body 19 and a plurality of bottom connecting elements 72 are further included. As shown in FIG. 8, the conductive structure 2b is formed or disposed on the top surface of the package structure 1 directly. Thus, the bottom surface 22 of the conductive structure 2b is in direct contact with the first surface 181 of the encapsulant 18. The circuit layers 24b are embedded in the dielectric layers 20. The inner via 25b tapers downwardly along a direction from the top surface 21 towards the bottom surface 22 of the conductive structure 2b. The bottommost inner via 25b terminate at or on, and contact the first electrical connectors 311 and the second electrical connectors 411.

The first surface 51 of the first upper element 5 and the first surface 61 of the second upper element 6 are electrically connected and bonded to the topmost circuit layer 24b of the conductive structure 2b through the first connecting elements 54 and the second connecting elements 64, respectively. In other words, the first upper element 5 and the second upper element 6 are electrically connected to the conductive structure 2b by flip-chip bonding. The underfill 17 is formed or disposed in the space between the upper elements (e.g., the first upper element 5 and the second upper element 6) and the conductive structure 2b so as to protect the first connecting elements 54 and the second connecting elements 64. The package body 19, for example, a molding compound with or without fillers, covers the package structure 1, the conductive structure 2b and the upper element (e.g., the first upper element 5 and the second upper element 6). The bottom connecting elements 72 (e.g., solder bumps or other conductive bumps) are formed or disposed on the second surface 32 of first lower element 3 and the second surface 42 of second lower element 4 for external connection.

Figure 9:
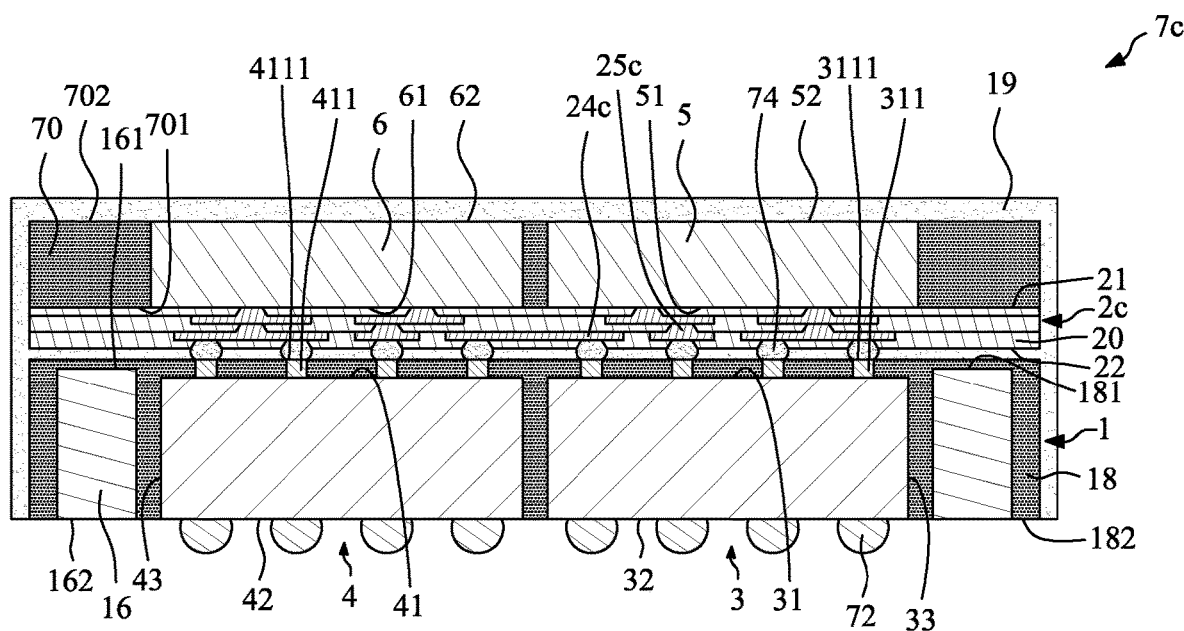
FIG. 9 illustrates a cross-sectional view of an assembly structure according to some embodiments of the present disclosure.

FIG. 9 illustrates a cross-sectional view of an assembly structure 7c according to some embodiments of the present disclosure. The assembly structure 7c of FIG. 9 is similar to the assembly structure 7b of FIG. 8 except that the conductive structure 2b of FIG. 8 is replaced by the conductive structure 2c of FIG. 9, the underfill 17 of FIG. 8 is omitted, and an insulation material 70 is further included. The insulation material 70 may be a molding compound with or without fillers, and may have a first surface 701 and a second surface 702 opposite to the first surface 701. The upper elements (e.g., the first upper element 5 and the second upper element 6) are disposed side by side and embedded in the insulation material 70 to form a reconstitution structure 9. The first surface 51 of the first upper element 5, the first surface 61 of the second upper element 6 and the first surface 701 of the insulation material 70 may be substantially coplanar with each other to form a bottom surface of the reconstitution structure 9. The second surface 52 of the first upper element 5, the second surface 62 of the second upper element 6 and the second surface 702 of the insulation material 70 may be substantially coplanar with each other to form a top surface of the reconstitution structure 9.

The conductive structure 2c is formed or disposed on the bottom surface of the reconstitution structure 9 (e.g., the first surface 51 of the first upper element 5, the first surface 61 of the second upper element 6 and the first surface 701 of the insulation material 70) directly. Thus, the top surface 21 of the conductive structure 2c is in direct contact with the bottom surface of the reconstitution structure 9 (e.g., the first surface 51 of the first upper element 5, the first surface 61 of the second upper element 6 and the first surface 701 of the insulation material 70). The circuit layers 24c are embedded in the dielectric layers 20. The inner via 25c tapers upwardly along a direction from the bottom surface 22 towards the top surface 21 of the conductive structure 2c. The topmost inner via 25c terminate at or on, and contact the first surface 51 of the first upper element 5 and the first surface 61 of the second upper element 6.

The first electrical connectors 311 of the first lower element 3 and the second electrical connectors 411 of the second lower element 4 are electrically connected and bonded to the bottommost circuit layer 24c of the conductive structure 2c through a plurality of third connecting elements 74 (e.g., solder bumps or other conductive bumps). The package body 19 covers the package structure 1, the conductive structure 2c, the reconstitution structure 9 and the third connecting elements 74.

Figure 10:
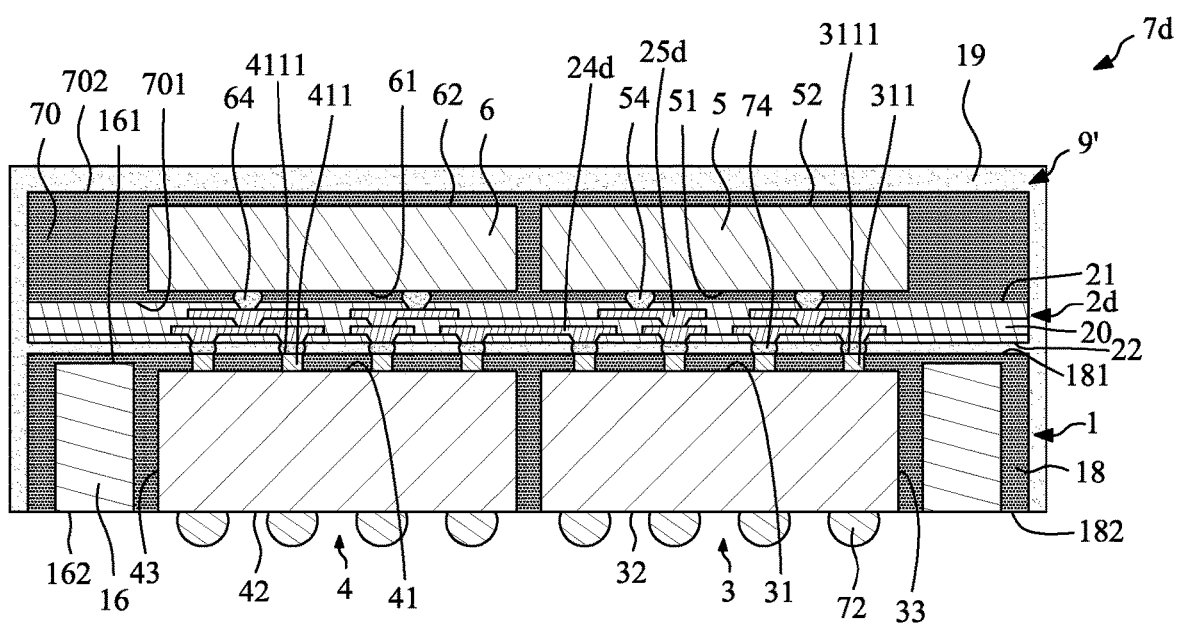
FIG. 10 illustrates a cross-sectional view of an assembly structure according to some embodiments of the present disclosure.
Figure 18:
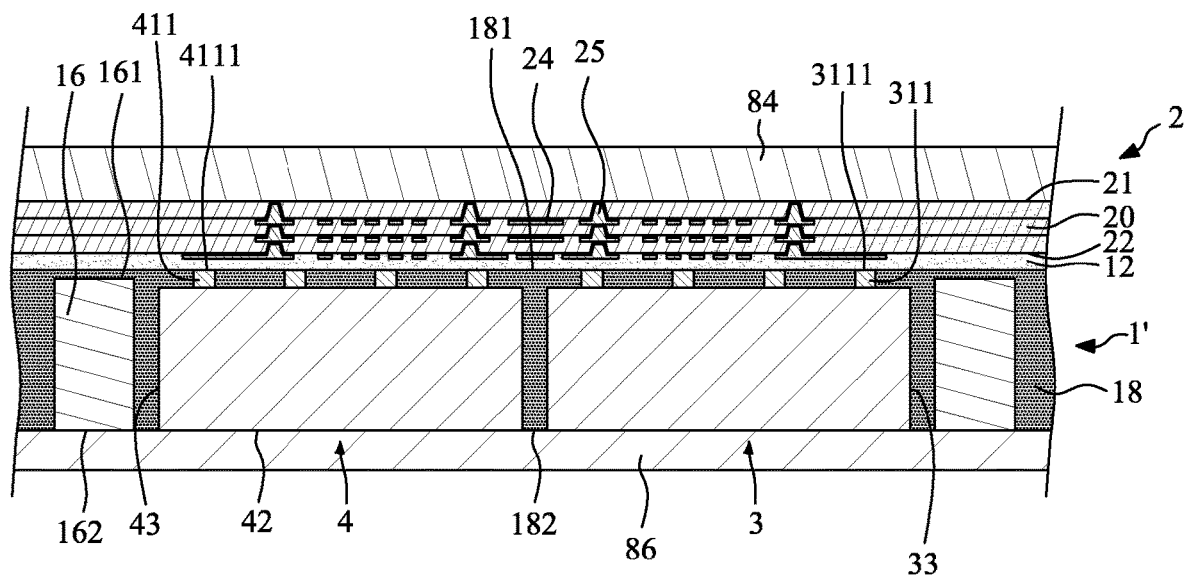
FIG. 18 illustrates one or more stages of an example of a method for manufacturing an assembly structure according to some embodiments of the present disclosure.

FIG. 10 illustrates a cross-sectional view of an assembly structure 7d according to some embodiments of the present disclosure. The assembly structure 7d of FIG. 18 is similar to the assembly structure 7b of FIG. 8 except that the conductive structure 2b of FIG. 8 is replaced by the conductive structure 2d of FIG. 10, and a top package 9' is further included. As shown in FIG. 10, the first surface 51 of the first upper element 5 and the first surface 61 of the second upper element 6 are electrically connected and bonded to the topmost circuit layer 24d of the conductive structure 2d through the first connecting elements 54 and the second connecting elements 64, respectively. In other words, the first upper element 5 and the second upper element 6 are electrically connected to the conductive structure 2d by flip-chip bonding. The insulation material 70 may be a molding compound with or without fillers, and may be formed or disposed on the top surface 21 of the conductive structure 2d. The insulation material 70 covers the first upper element 5, the second upper element 6, the first connecting elements 54 and the second connecting elements 64 so as to form the top package 9'.

The circuit layers 24d are embedded in the dielectric layers 20. The inner via 25d tapers downwardly along a direction from the top surface 21 towards the bottom surface 22 of the conductive structure 2d. The bottommost inner vias 25d are exposed from the bottom surface 22 of the conductive structure 2d, and are electrically connected and bonded to the first electrical connectors 311 of the first lower element 3 and the second electrical connectors 411 of the second lower element 4 through a plurality of third connecting elements 74 (e.g., solder bumps or other conductive bumps). The package body 19 covers the package structure 1, the top package 9' and the third connecting elements 74.

FIG. 11 through FIG. 16 illustrate a method for manufacturing a package structure according to some embodiments of the present disclosure. In some embodiments, the method is for manufacturing the package structure 1 shown in FIG. 1 and FIG. 2.

Figure 11:
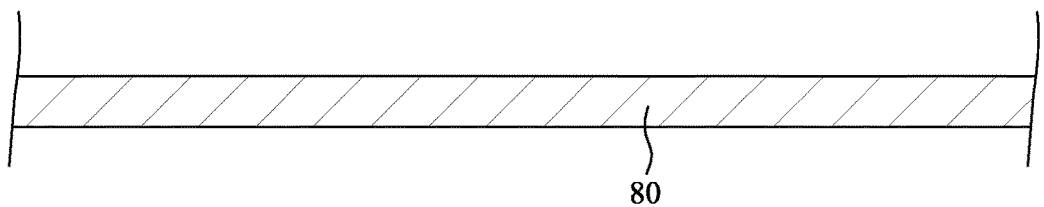
FIG. 11 illustrates one or more stages of an example of a method for manufacturing a package structure according to some embodiments of the present disclosure.

Referring to FIG. 11, a carrier 80 is provided.

Figure 12:
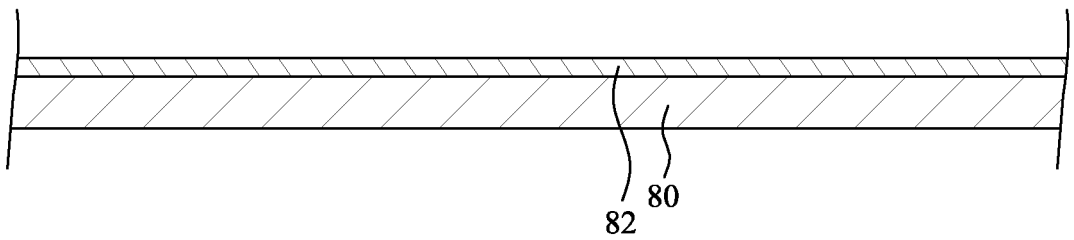
FIG. 12 illustrates one or more stages of an example of a method for manufacturing a package structure according to some embodiments of the present disclosure.

Referring to FIG. 12, an adhesive layer 82 is formed or disposed on the carrier 80 by, for example, coating.

Figure 13:
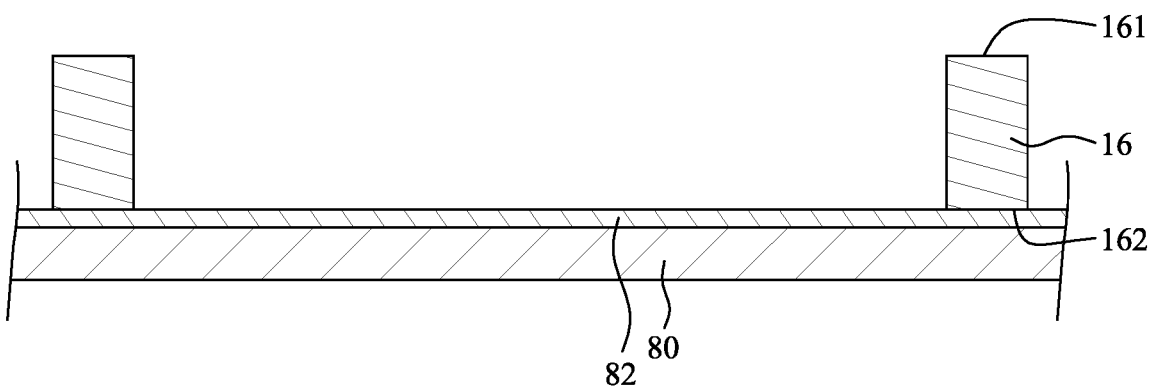
FIG. 13 illustrates one or more stages of an example of a method for manufacturing a package structure according to some embodiments of the present disclosure.

Referring to FIG. 13, a reinforcement structure 16 is formed on the adhesive layer 82 on the carrier 80. The reinforcement structure 16 is a wall structure, and has a top surface 161 and a bottom surface 162 opposite to the top surface 161. As shown in FIG. 2, the reinforcement structure 16 may be in a continuous ring shape from a top view. As shown in FIG. 5, the reinforcement structure 16c may be a discontinuous structure, and may be not a complete ring from a top view.

Figure 14:
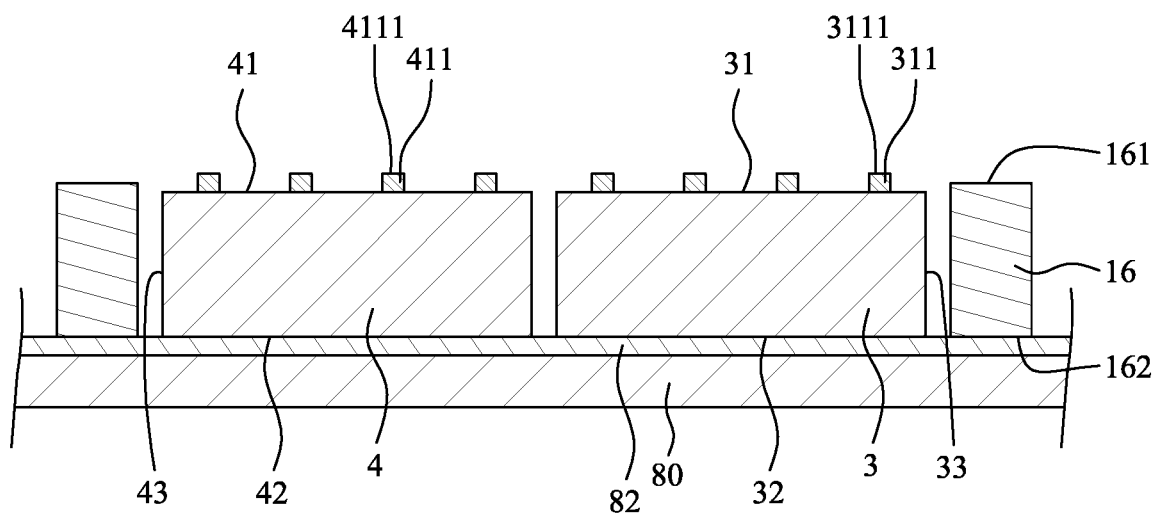
FIG. 14 illustrates one or more stages of an example of a method for manufacturing a package structure according to some embodiments of the present disclosure.

Referring to FIG. 14, a plurality of lower elements (e.g., a first lower element 3 and a second lower element 4) are disposed side by side on the adhesive layer 82 on the carrier 80. The first lower element 3 has a first surface 31 and a second surface 32 opposite to the first surface, and a periphery lateral surface 33 extending between the first surface 31 and the second surface 32. The first lower element 3 may further include a plurality of first electrical connectors 311 disposed adjacent to the first surface 31 of the first lower element 3. Each of the first electrical connectors 311 has a top surface 3111. The second lower element 4 has a first surface 41, a second surface 42 opposite to the first surface 41, and a periphery lateral surface 43 extending between the first surface 41 and the second surface 42. The second lower element 4 may further include a plurality of second electrical connectors 411 disposed adjacent to the first surface 41 of the second lower element 4. Each of the second electrical connectors 411 has a top surface 4111. The second surface 32 of the first lower element 3 and the second surface 42 of the second lower element 4 are disposed on and attached to the adhesive layer 82 on the carrier 80. In addition, the lower elements (e.g., the first lower element 3 and the second lower element 4) are disposed in a space defined by the reinforcement structure 16, and are surrounded by the reinforcement structure 16. In some embodiments, the first electrical connectors 311 and the second electrical connectors 411 may be omitted, and a portion of a topmost circuit layer of the lower elements (e.g., the first lower element 3 and the second lower element 4) may be used as electrical connectors.

Figure 15:
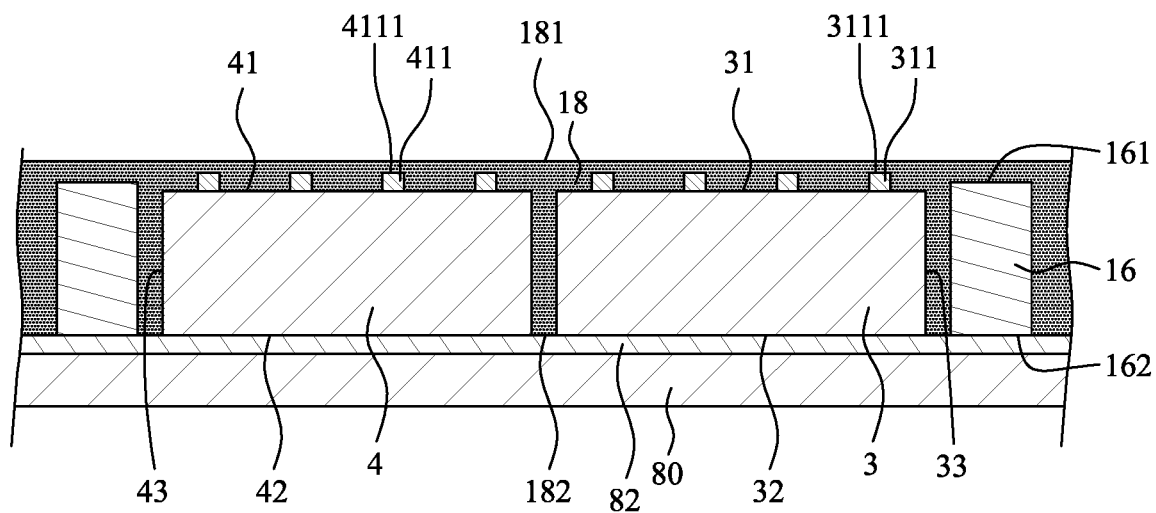
FIG. 15 illustrates one or more stages of an example of a method for manufacturing package structure according to some embodiments of the present disclosure.

Referring to FIG. 15, an encapsulant 18 (e.g., a molding compound) is formed or disposed on the adhesive layer 82 on the carrier 80 to cover the lower elements (e.g., the first lower element 3 and the second lower element 4) and the reinforcement structure 16. The encapsulant 18 has a first surface 181 and a second surface 182 opposite to the first surface 181. The first surface 181 corresponds to the electrical connectors (e.g., the first electrical connectors 311 and the second electrical connectors 411) of the lower elements (e.g., the first lower element 3 and the second lower element 4).

Figure 16:
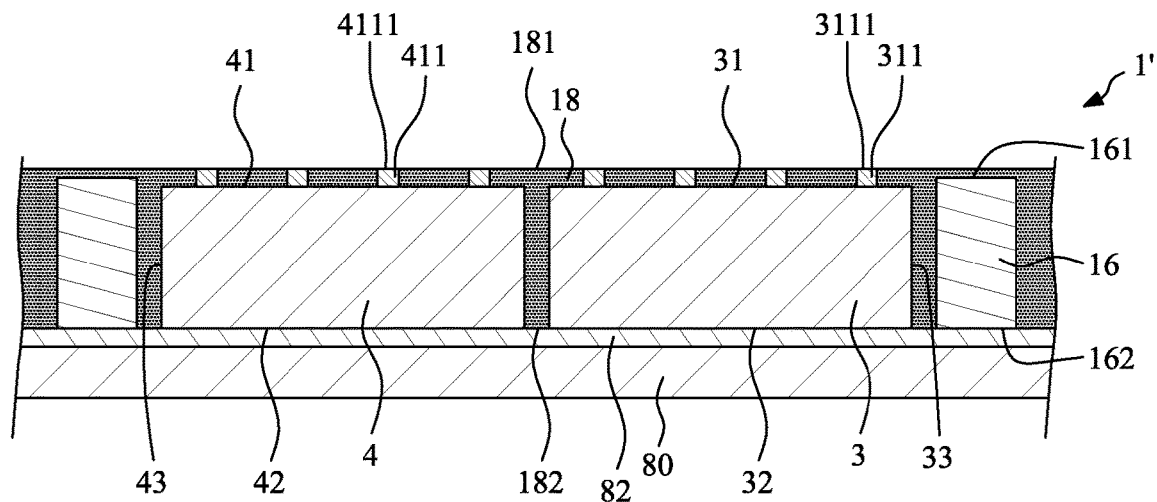
FIG. 16 illustrates one or more stages of an example of a method for manufacturing a package structure according to some embodiments of the present disclosure.

Referring to FIG. 16, the encapsulant 18 is thinned from its first surface 181 by, for example, grinding, so as to expose the electrical connectors (e.g., the first electrical connectors 311 and the second electrical connectors 411) of the lower elements (e.g., the first lower element 3 and the second lower element 4). Meanwhile, a reconstitution structure 1' (e.g., a reconstitution substrate) is formed on the adhesive layer 82 on the carrier 80. In some embodiments, the top surfaces 3111 of the first electrical connectors 311 of the first lower element 3 and the top surfaces 4111 of the second electrical connectors 411 of the second lower element 4 are substantially coplanar with the first surface 181 of the encapsulant 18, so that the first electrical connectors 311 of the first lower element 3 and the second electrical connectors 411 of the second lower element 4 are exposed from the first surface 181 of the encapsulant 18. Further, the encapsulant 18 covers the top surface 161 of the reinforcement structure 16.

Then, the adhesive layer 82 and the carrier 80 are removed from the reconstitution structure 1'. Then, a singulation process is conducted to the reconstitution structure 1' to obtain a plurality of package structures 1 as shown in FIG. 1.

FIG. 17 through FIG. 22 illustrate a method for manufacturing an assembly structure according to some embodiments of the present disclosure. In some embodiments, the method is for manufacturing the assembly structure 7 shown in FIG. 6.

Figure 17:
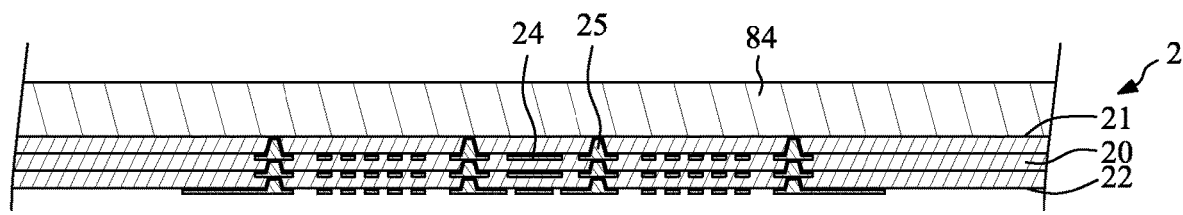
FIG. 17 illustrates one or more stages of an example of a method for manufacturing an assembly structure according to some embodiments of the present disclosure.

Referring to FIG. 17, a conductive structure 2 is formed on a carrier 84. In some embodiments, the conductive structure 2 may include at least one dielectric layer 20, at least one circuit layer (including, for example, at least one circuit layer 24) in contact with the dielectric layer 20, and a plurality of inner vias 25. The conductive structure 2 has a top surface 21 and a bottom surface 22 opposite to the top surface 21. The dielectric layers 20 are stacked on one another. The circuit layers 24 may be fan-out circuit layers or redistribution layers (RDLs), and an L/S of the circuit layers 24 may be less than or equal to about 2 μm/about 2 μm, or less than or equal to about 1.8 μm/about 1.8 μm. In some embodiments, the circuit layer 24 is embedded in the corresponding dielectric layer 20. The inner vias 25 are disposed between two adjacent circuit layers 24 and the top circuit layer 28 for electrically connecting the two circuit layers 24. In some embodiments, each inner via 25 and the corresponding circuit layer 24 may be formed integrally as a monolithic or one-piece structure. Each inner via 25 tapers upwardly along a direction from the bottom surface 22 towards the top surface 21 of the conductive structure 2.

Referring to FIG. 18, the reconstitution structure 1' of FIG. 16 is attached to a tape 86 (or a carrier). Then, the conductive structure 2 (with the carrier 84) is attached to the reconstitution structure 1' through an intermediate layer 12. The bottom surface 22 of the conductive structure 2 is attached to the first surface 181 of the encapsulant 18 of the reconstitution structure 1' through the intermediate layer 12. In some embodiments, the intermediate layer 12 may be an adhesion layer that is cured from an adhesive material (e.g., includes a cured adhesive material such as an adhesive polymeric material) or an underfill. The bottommost circuit layer 24 of the conductive structure 2 is embedded in the intermediate layer 12. In addition, a material of the intermediate layer 12 may include Ajinomoto build-up film (ABF). In addition, the intermediate layer 12 is not a build-up layer of the conductive structure 2. That is, the intermediate layer 12 is different from the dielectric layer 20 of the conductive structure 2.

Figure 19:
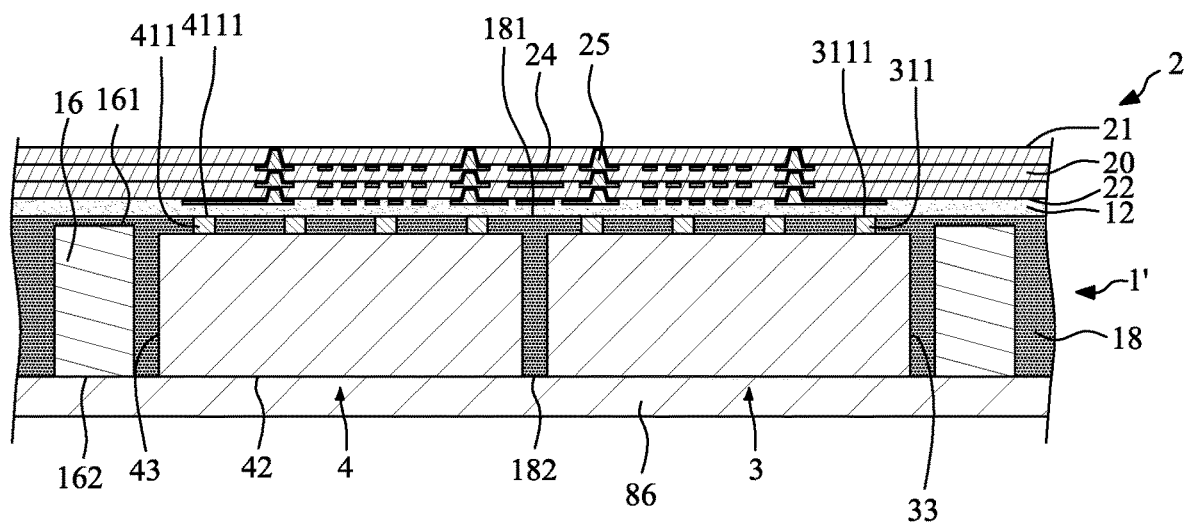
FIG. 19 illustrates one or more stages of an example of a method for manufacturing an assembly structure according to some embodiments of the present disclosure.

Referring to FIG. 19, the carrier 84 is removed from the conductive structure 2.

Figure 20:
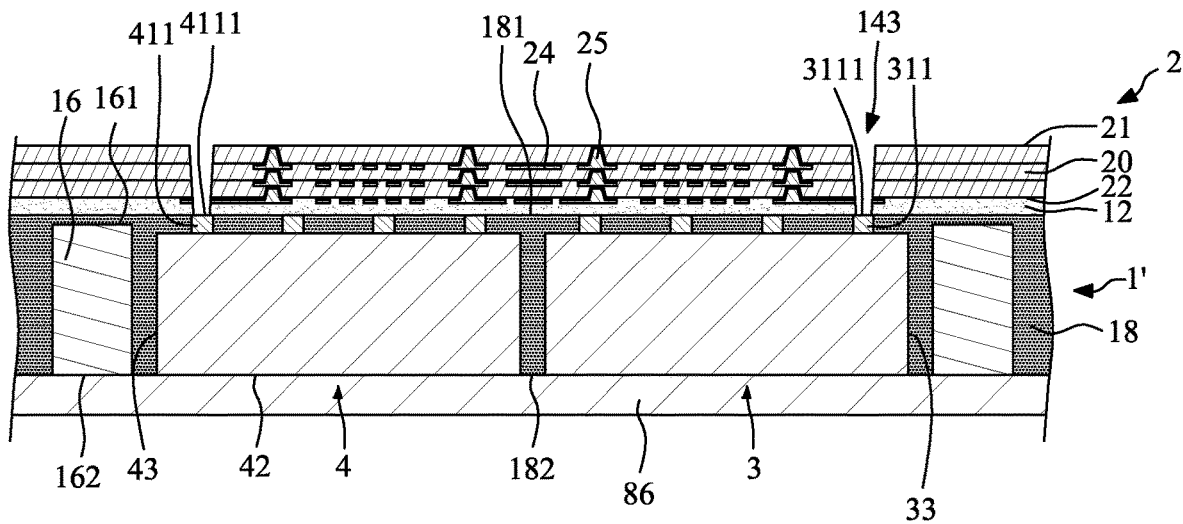
FIG. 20 illustrates one or more stages of an example of a method for manufacturing an assembly structure according to some embodiments of the present disclosure.

Referring to FIG. 20, at least one through hole 143 is formed to extend through the conductive structure 2 and the intermediate layer 12 by, for example, laser drilling, so as to expose the electrical connectors (e.g., the first electrical connectors 311 and the second electrical connectors 411) of the lower elements (e.g., the first lower element 3 and the second lower element 4).

Figure 21:
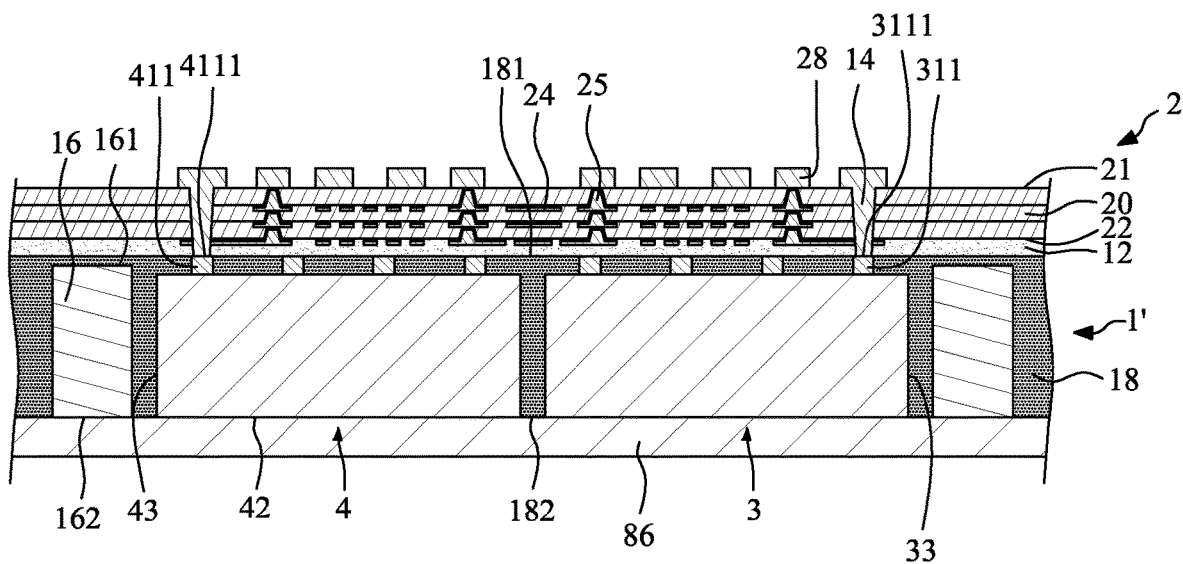
FIG. 21 illustrates one or more stages of an example of a method for manufacturing an assembly structure according to some embodiments of the present disclosure.

Referring to FIG. 21, at least one upper through via 14 is formed in the through hole 143, so that the upper through via 14 extends through the conductive structure 2 and the intermediate layer 12, and electrically connects the electrical connectors (e.g., the first electrical connectors 311 and the second electrical connectors 411) of the lower elements (e.g., the first lower element 3 and the second lower element 4). Thus, the conductive structure 2 is electrically connected to the reconstitution structure 1' through the upper through via(s) 14. Further, the upper through via 14 tapers downwardly. Thus, a tapering direction of the inner via 25 of the conductive structure 2 is different from a tapering direction of the upper through via 14. Meanwhile, a top circuit layer 28 may be formed on the top surface 21 of the conductive structure 2. In some embodiments, the upper through via 14 and the top circuit layer 28 may be formed integrally as a monolithic or one-piece structure.

Figure 22:
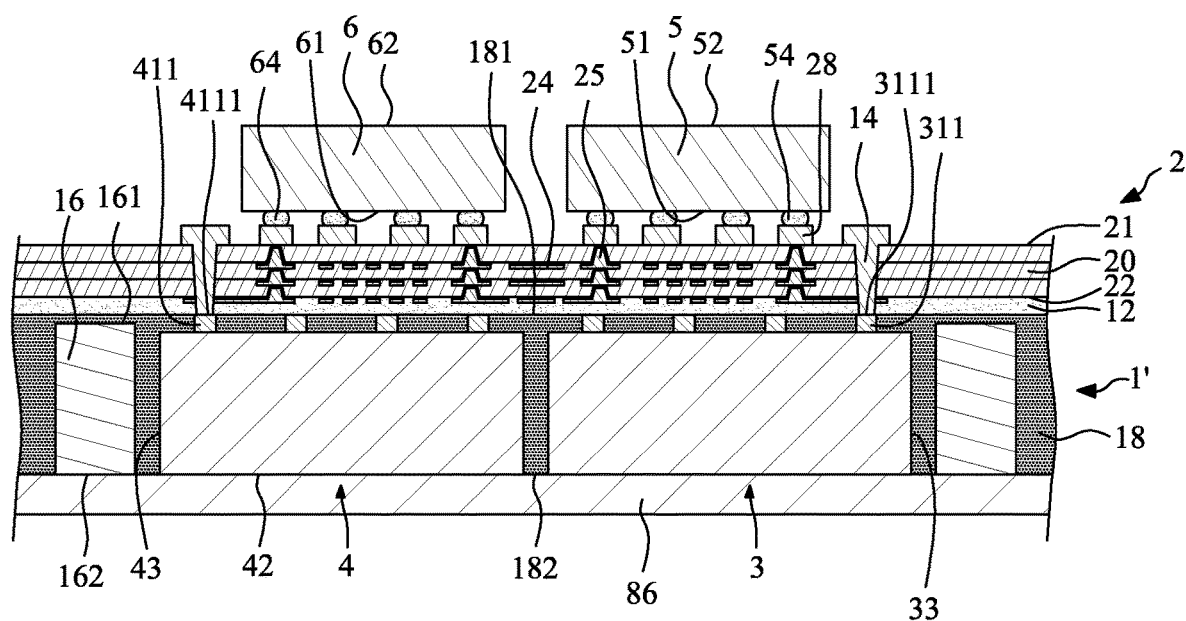
FIG. 22 illustrates one or more stages of an example of a method for manufacturing an assembly structure according to some embodiments of the present disclosure.

Referring to FIG. 22, at least one upper element (including, for example, a first upper element 5 and a second upper element 6) is electrically connected to the top circuit layer 28 of the conductive structure 2 by flip-chip bonding. A first surface 51 of the first upper element 5 is electrically connected and bonded to the top circuit layer 28 of the conductive structure 2 through the first connecting elements 54. A first surface 61 of the second upper element 6 is electrically connected and bonded to the top circuit layer 28 of the conductive structure 2 through the second connecting elements 64.

Then, a singulation process is conducted, and the tape 86 is removed, so as to obtain a plurality of assembly structures 7 shown in FIG. 6.

FIG. 23 through FIG. 27 illustrate a method for manufacturing an assembly structure according to some embodiments of the present disclosure. In some embodiments, the method is for manufacturing the assembly structure 7b shown in FIG. 8.

Figure 23:
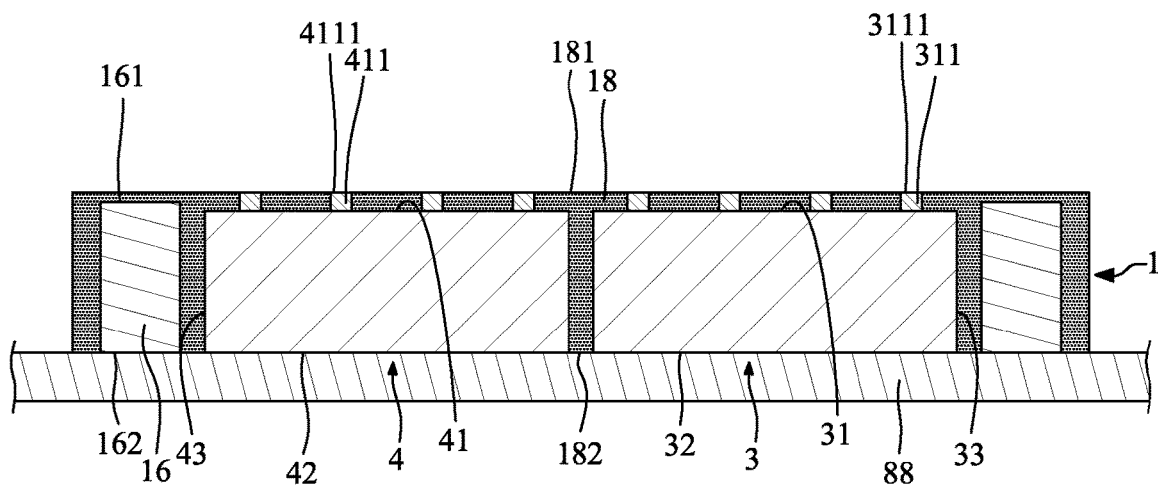
FIG. 23 illustrates one or more stages of an example of a method for manufacturing an assembly structure according to some embodiments of the present disclosure.

Referring to FIG. 23, at least one package structure 1 is disposed on a tape 88 (or a carrier).

Figure 24:
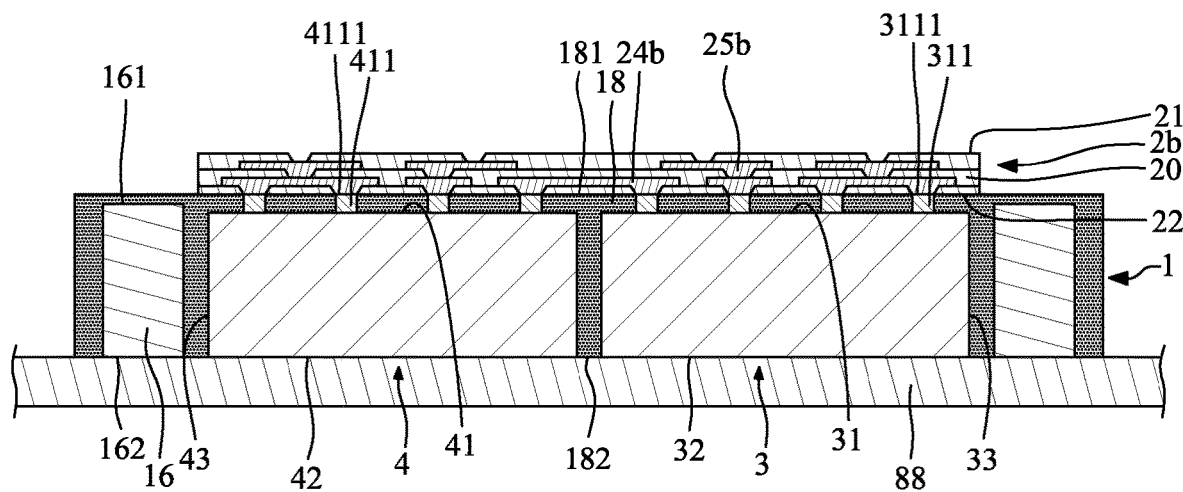
FIG. 24 illustrates one or more stages of an example of a method for manufacturing an assembly structure according to some embodiments of the present disclosure.

Referring to FIG. 24, a conductive structure 2b is formed on the first surface 181 of the encapsulant 18 of the package structure 1 directly. Thus, the conductive structure 2b is built on and in direct contact with the first surface 181 of the encapsulant 18 of the package structure 1. The circuit layers 24b are embedded in the dielectric layers 20. The inner via 25b tapers downwardly along a direction from the top surface 21 towards the bottom surface 22 of the conductive structure 2b. The bottommost inner via 25b terminate at or on, and contact the first electrical connectors 311 and the second electrical connectors 411. Thus, the conductive structure 2b is electrically connected to the electrical connectors (e.g., the first electrical connectors 311 and the second electrical connectors 411) of the lower elements (e.g., the first lower element 3 and the second lower element 4).

Figure 25:
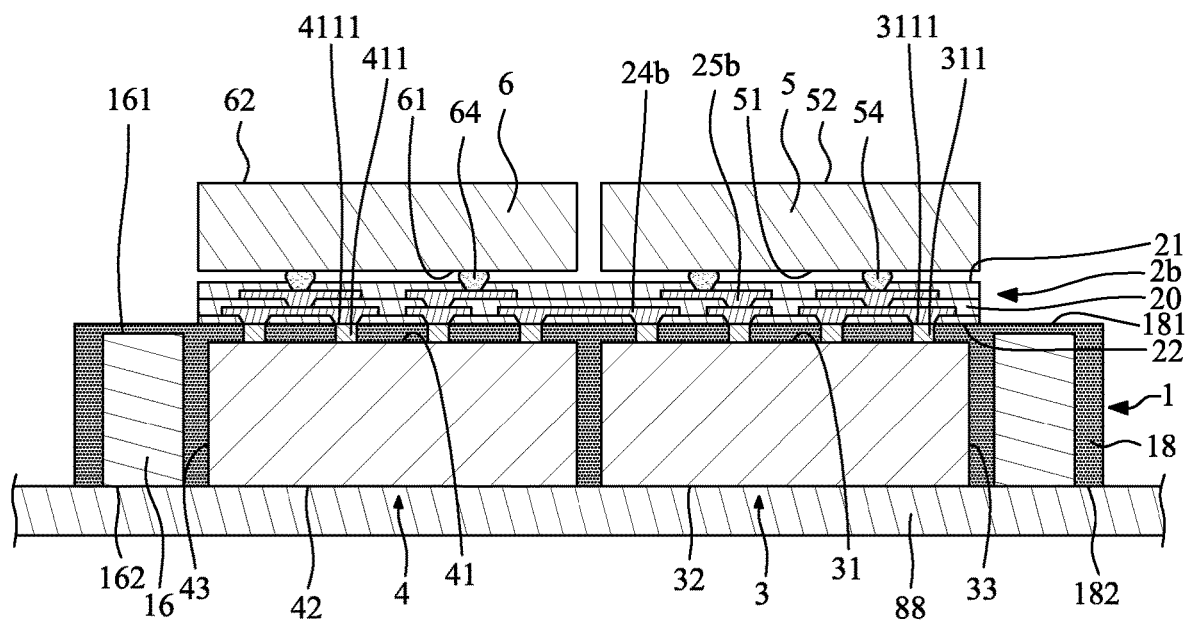
FIG. 25 illustrates one or more stages of an example of a method for manufacturing an assembly structure according to some embodiments of the present disclosure.

Referring to FIG. 25, at least one upper element (including, for example, a first upper element 5 and a second upper element 6) is electrically connected to the topmost circuit layer 24b of the conductive structure 2b by flip-chip bonding.

Figure 26:
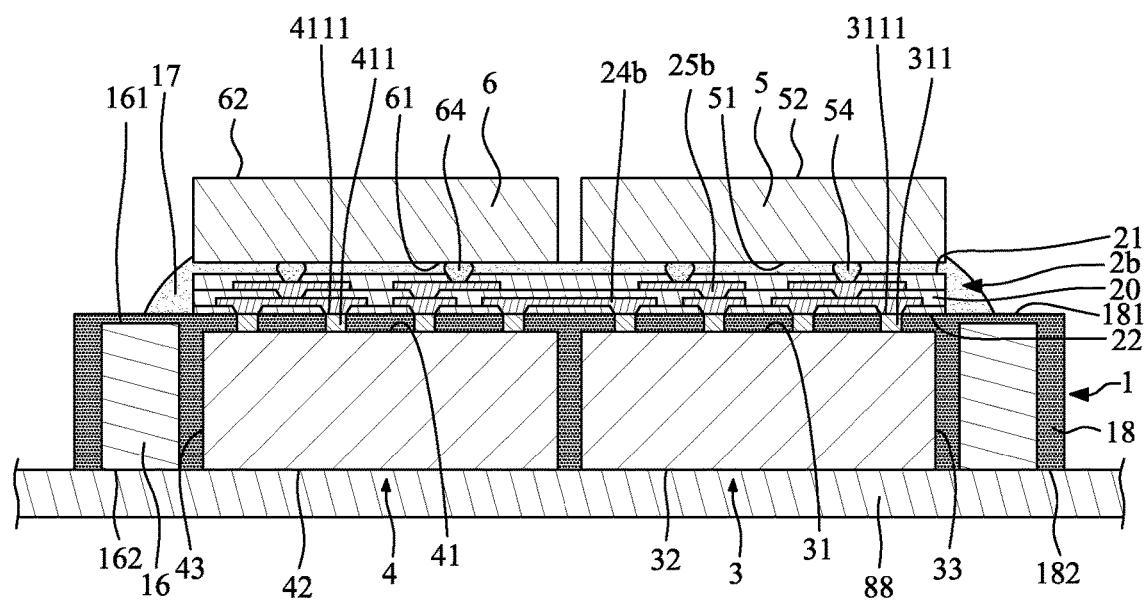
FIG. 26 illustrates one or more stages of an example of a method for manufacturing an assembly structure according to some embodiments of the present disclosure.

Referring to FIG. 26, an underfill 17 is formed or disposed in the space between the upper elements (e.g., the first upper element 5 and the second upper element 6) and the conductive structure 2b so as to protect the first connecting elements 54 and the second connecting elements 64.

Figure 27:
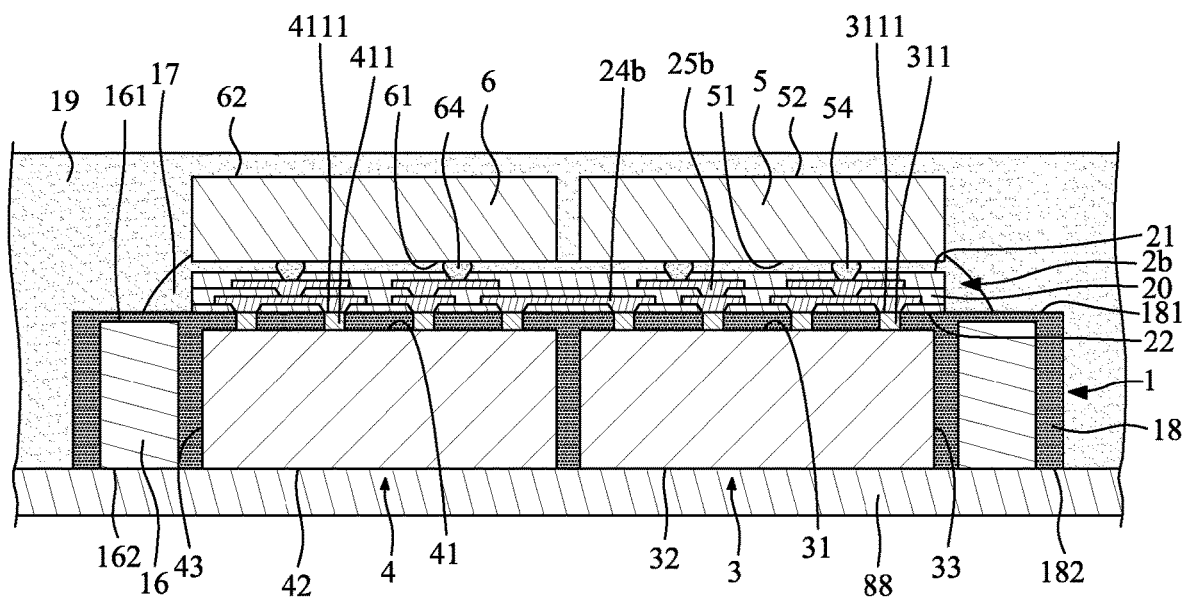
FIG. 27 illustrates one or more stages of an example of a method for manufacturing an assembly structure according to some embodiments of the present disclosure.

Referring to FIG. 27, a package body 19, for example, a molding compound with or without fillers, is formed or disposed on the tape 88, so as to cover the package structure 1, the conductive structure 2b, the underfill 17 and the upper element (e.g., the first upper element 5 and the second upper element 6).

Then, the package body 19 is thinned from its top surface by, for example, grinding, so as to expose the second surface 52 of the first upper element 5 and the second surface 62 of the second upper element 6. Then, the tape 86 is removed. Then, a plurality of bottom connecting elements 72 are formed or disposed on the second surface 32 of first lower element 3 and the second surface 42 of second lower element 4 for external connection. Then, a singulation process is conducted to obtain a plurality of assembly structures 7b shown in FIG. 8.

FIG. 28 through FIG. 31 illustrate a method for manufacturing an assembly structure according to some embodiments of the present disclosure. In some embodiments, the method is for manufacturing the assembly structure 7c shown in FIG. 9.

Figure 28:
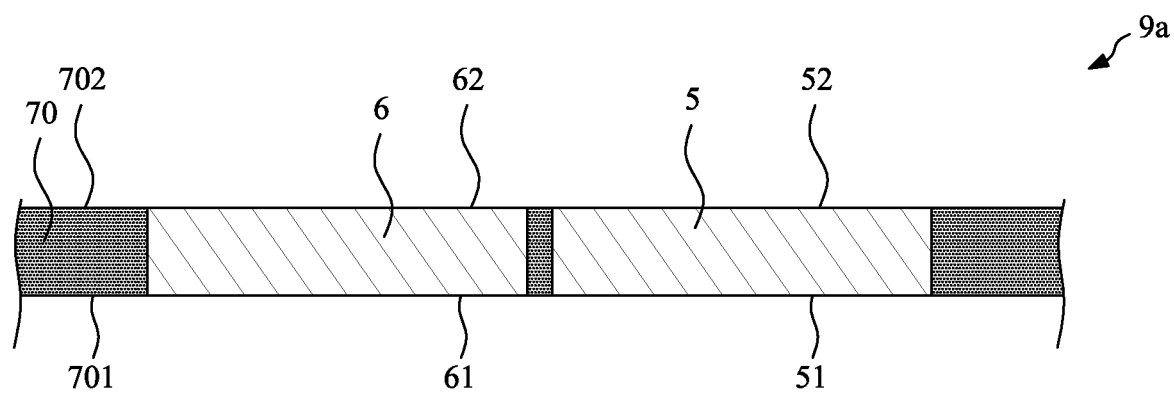
FIG. 28 illustrates one or more stages of an example of a method for manufacturing an assembly structure according to some embodiments of the present disclosure.

Referring to FIG. 28, a plurality of upper elements (e.g., the first upper element 5 and the second upper element 6) are provided. Then, the upper elements (e.g., the first upper element 5 and the second upper element 6) are disposed side by side and encapsulated in an insulation material 70 to form a reconstitution package 9a.

The insulation material 70 may be a molding compound with or without fillers, and may have a first surface 701 and a second surface 702 opposite to the first surface 701. The first surface 51 of the first upper element 5, the first surface 61 of the second upper element 6 and the first surface 701 of the insulation material 70 may be substantially coplanar with each other to form a bottom surface of the reconstitution package 9a. The second surface 52 of the first upper element 5, the second surface 62 of the second upper element 6 and the second surface 702 of the insulation material 70 may be substantially coplanar with each other to form a top surface of the reconstitution package 9a. The reconstitution package 9a includes a plurality of reconstitution structures 9.

Figure 29:
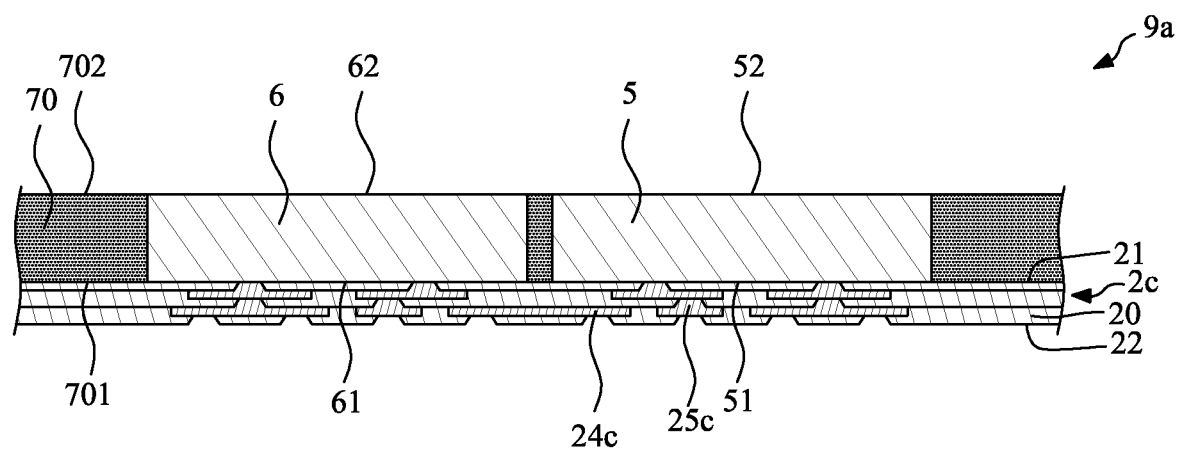
FIG. 29 illustrates one or more stages of an example of a method for manufacturing assembly structure according to some embodiments of the present disclosure.

Referring to FIG. 29, a conductive structure 2c is formed on the bottom surface of the reconstitution package 9a (e.g., the first surface 51 of the first upper element 5, the first surface 61 of the second upper element 6 and the first surface 701 of the insulation material 70) directly. Thus, the top surface 21 of the conductive structure 2c is in direct contact with the bottom surface of the reconstitution package 9a (e.g., the first surface 51 of the first upper element 5, the first surface 61 of the second upper element 6 and the first surface 701 of the insulation material 70). The circuit layers 24c are embedded in the dielectric layers 20. The inner via 25c tapers upwardly along a direction from the bottom surface 22 towards the top surface 21 of the conductive structure 2c. The topmost inner via 25c terminate at or on, and contact the first surface 51 of the first upper element 5 and the first surface 61 of the second upper element 6.

Figure 30:
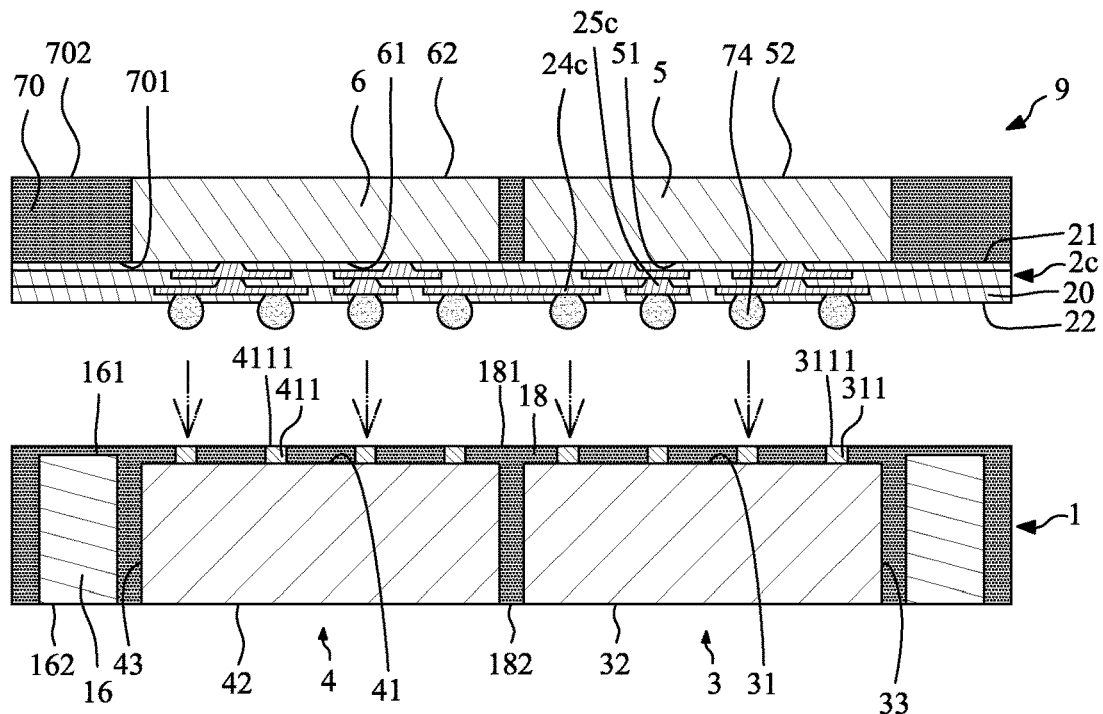
FIG. 30 illustrates one or more stages of an example of a method for manufacturing an assembly structure according to some embodiments of the present disclosure.

Referring to FIG. 30, a plurality of third connecting elements 74 (e.g., solder bumps or other conductive bumps) are formed or disposed on the bottom surface 22 of the conductive structure 2c to contact the bottommost circuit layer 24c of the conductive structure 2c. Then, a singulation process is conducted to the reconstitution package 9a to form a plurality of reconstitution structures 9.

Figure 31:
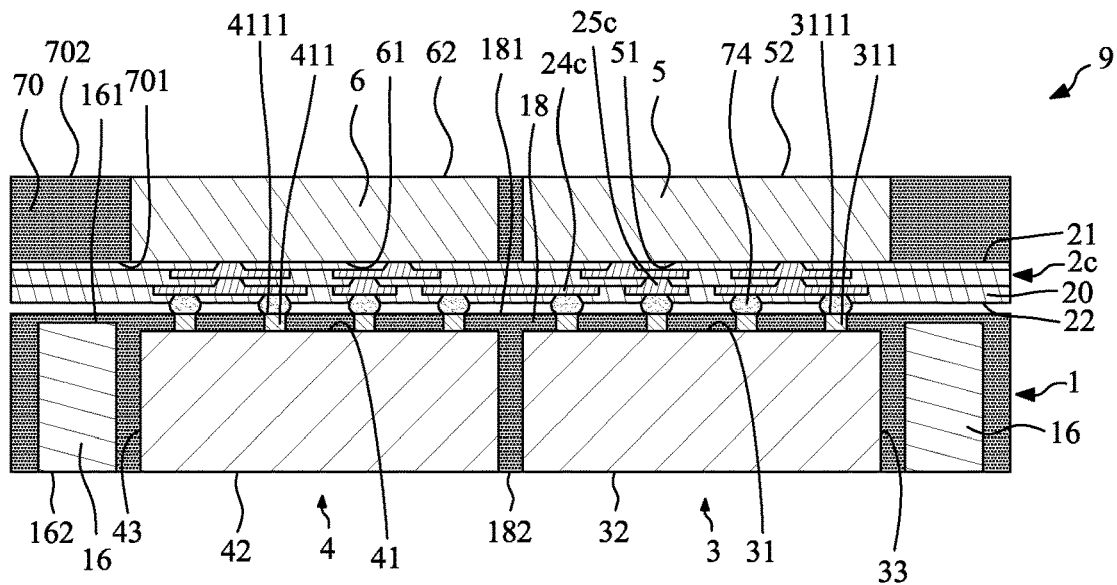
FIG. 31 illustrates one or more stages of an example of a method for manufacturing an assembly structure according to some embodiments of the present disclosure.

Referring to FIG. 31, the reconstitution structure 9 is attached to a package structure 1 through the third connecting elements 74. Thus, the first electrical connectors 311 of the first lower element 3 and the second electrical connectors 411 of the second lower element 4 are electrically connected and bonded to the bottommost circuit layer 24c of the conductive structure 2c through the third connecting elements 74.

Then, a package body 19 is formed or disposed to cover the package structure 1, the conductive structure 2c, the reconstitution structure 9 and the third connecting elements 74. Then, a plurality of bottom connecting elements 72 are formed or disposed on the second surface 32 of first lower element 3 and the second surface 42 of second lower element 4 for external connection. Then, a singulation process is conducted to obtain a plurality of assembly structures 7c shown in FIG. 9.

FIG. 32 through FIG. 36 illustrate a method for manufacturing an assembly structure according to some embodiments of the present disclosure. In some embodiments, the method is for manufacturing the assembly structure 7d shown in FIG. 10.

Figure 32:
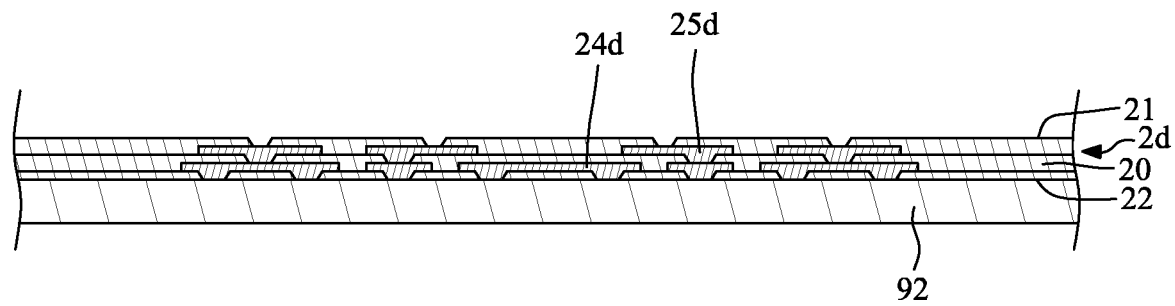
FIG. 32 illustrates one or more stages of an example of a method for manufacturing an assembly structure according to some embodiments of the present disclosure.

Referring to FIG. 32, a conductive structure 2d is formed on a carrier 92. The circuit layers 24d are embedded in the dielectric layers 20. The inner via 25d tapers downwardly along a direction from the top surface 21 towards the bottom surface 22 of the conductive structure 2d.

Figure 33:
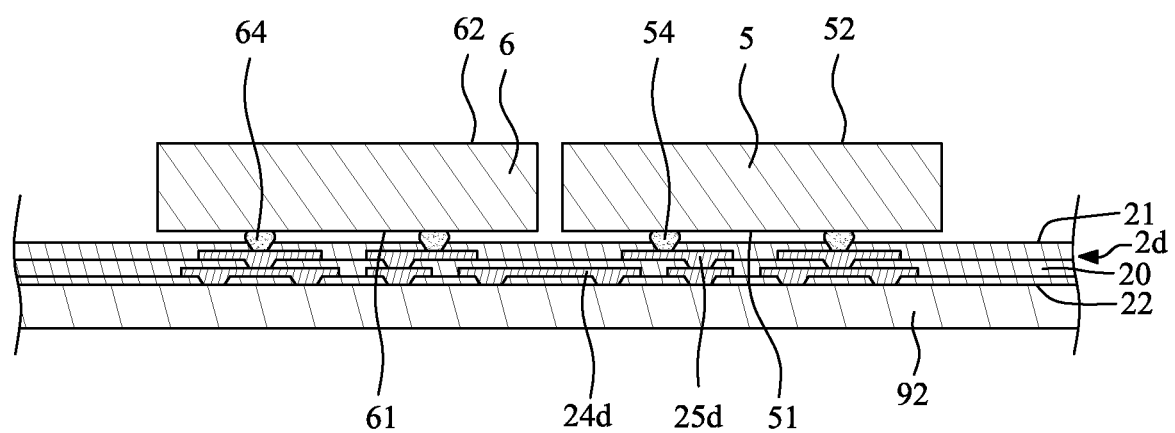
FIG. 33 illustrates one or more stages of an example of a method for manufacturing an assembly structure according to some embodiments of the present disclosure.

Referring to FIG. 33, at least one upper element (including, for example, a first upper element 5 and a second upper element 6) is attached to the topmost circuit layer 24d of the conductive structure 2d by flip-chip bonding.

Figure 34:
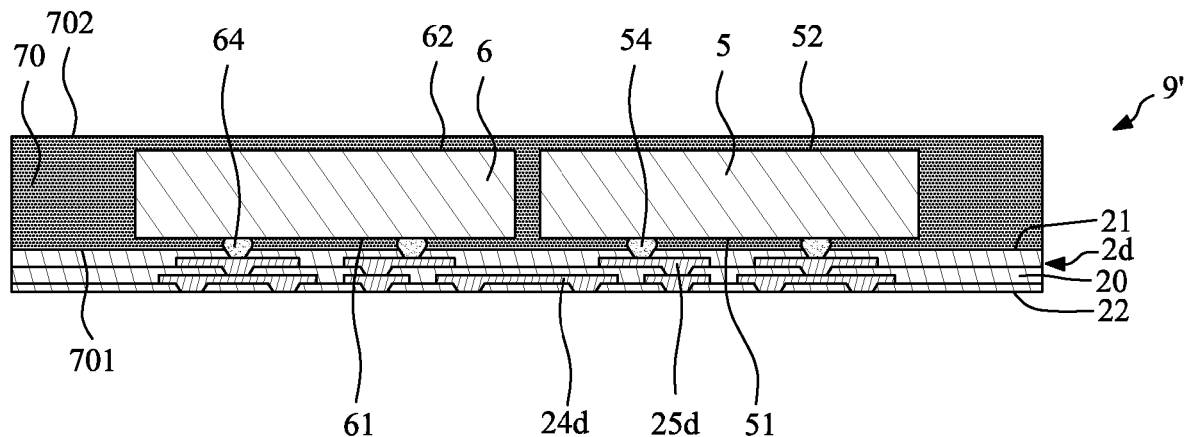
FIG. 34 illustrates one or more stages of an example of a method for manufacturing an assembly structure according to some embodiments of the present disclosure.

Referring to FIG. 34, an insulation material 70 is formed or disposed on the top surface 21 of the conductive structure 2d to cover the first upper element 5, the second upper element 6, the first connecting elements 54, the second connecting elements 64 and the top surface 21 of the conductive structure 2d. Then, a singulation process is conducted to obtain a plurality of top packages 9'. Meanwhile, the bottommost inner vias 25d are exposed from the bottom surface 22 of the conductive structure 2d.

Figure 35:
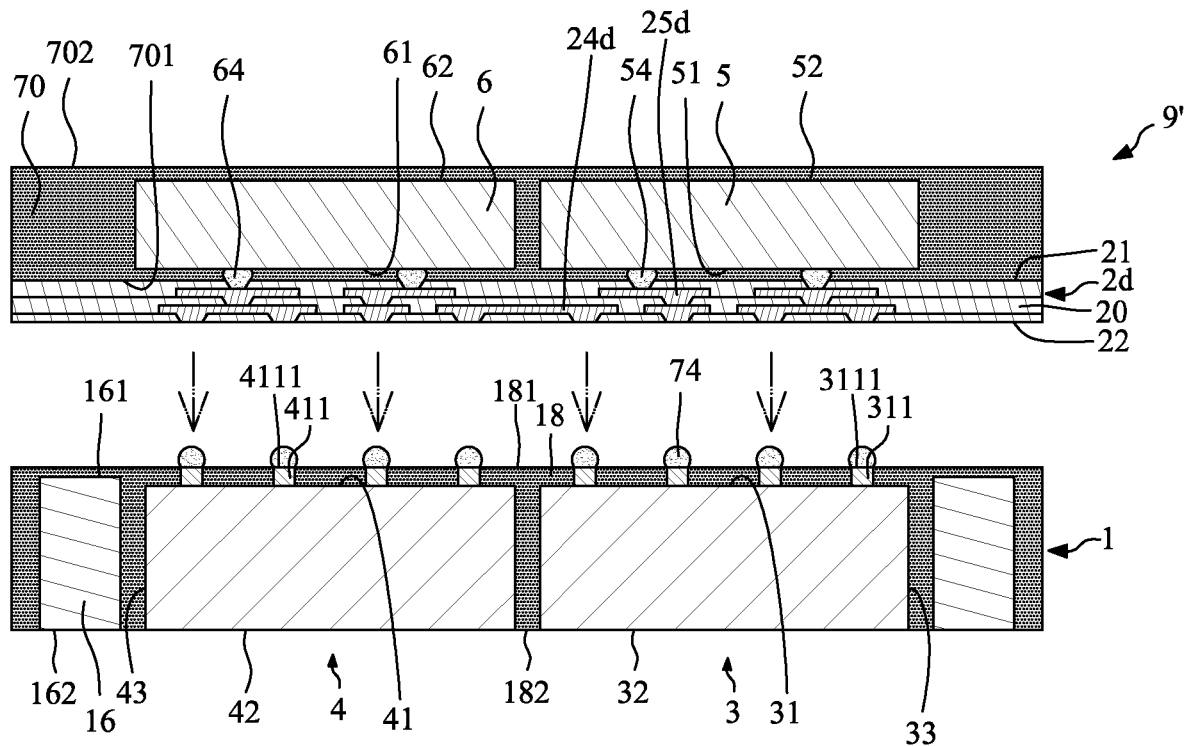
FIG. 35 illustrates one or more stages of an example of a method for manufacturing an assembly structure according to some embodiments of the present disclosure.

Referring to FIG. 35, a plurality of third connecting elements 74 (e.g., solder bumps or other conductive bumps) are formed or disposed on a package structure 1.

Figure 36:
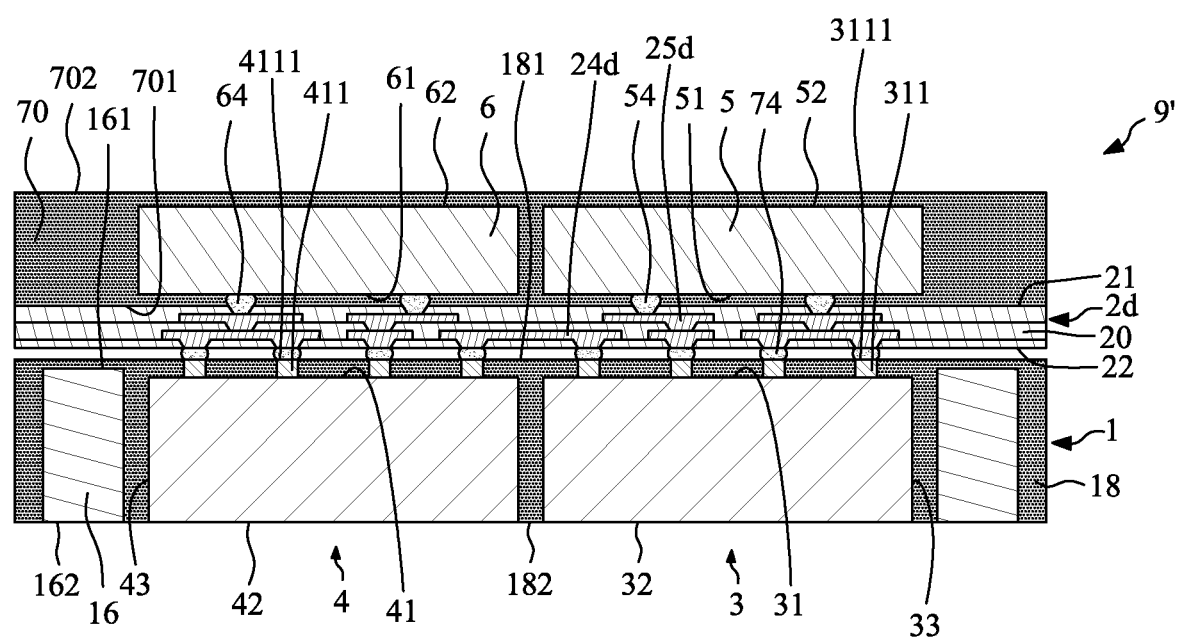
FIG. 36 illustrates one or more stages of an example of a method for manufacturing an assembly structure according to some embodiments of the present disclosure.

Referring to FIG. 36, the bottommost inner vias 25d of the conductive structure 2d are electrically connected and bonded to the first electrical connectors 311 of the first lower element 3 and the second electrical connectors 411 of the second lower element 4 through the plurality of third connecting elements 74.

Then, a package body 19 is formed or disposed to cover the package structure 1, the top package 9' and the third connecting elements 74. Then, a plurality of bottom connecting elements 72 are formed or disposed on the second surface 32 of first lower element 3 and the second surface 42 of second lower element 4 for external connection. Then, a singulation process is conducted to obtain a plurality of assembly structures 7d shown in FIG. 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a first lower element having a first surface and a second surface opposite to the first surface, and including a plurality of first electrical connectors disposed adjacent to the first surface thereof;
   a second lower element disposed side by side with the first lower element, wherein the second lower element has a first surface and a second surface opposite to the first surface, and includes a plurality of second electrical connectors disposed adjacent to the first surface thereof;
   a reinforcement structure surrounding the first lower element and the second lower element, and having a top surface; and
   an encapsulant covering the first lower element, the second lower element and the top surface of the reinforcement structure, wherein the encapsulant has a first surface and a second surface opposite to the first surface, the first electrical connectors of the first lower element and the second electrical connectors of the second lower element are exposed from the first surface of the encapsulant.

2. The package structure of claim 1, wherein the first lower element is a substrate, a semiconductor chip or a semiconductor die, and the second lower element is a substrate, a semiconductor chip or a semiconductor die.

3. The package structure of claim 1, wherein the reinforcement structure is a wall structure.

4. The package structure of claim 1, wherein a material of the reinforcement structure includes metal.

5. The package structure of claim 1, wherein the reinforcement structure is in a ring shape from a top view.

6. The package structure of claim 1, wherein the reinforcement structure is a monolithic structure.

7. The package structure of claim 1, wherein the reinforcement structure includes a plurality of wall segments spaced apart from each other.

8. The package structure of claim 1, wherein the reinforcement structure is electrically isolated from the first lower element and the second lower element.

9. The package structure of claim 1, wherein each of the first electrical connectors of the first lower element has a top surface, each of the second electrical connectors of the second lower element has a top surface, and the top surfaces of the first electrical connectors of the first lower element and the top surfaces of the second electrical connectors of the second lower element are substantially coplanar with the first surface of the encapsulant.

10. The package structure of claim 1, wherein a bottom surface of the reinforcement structure, a second surface of the encapsulant, the second surface of first lower element and the second surface of second lower element are substantially coplanar with each other.

11. The package structure of claim 1, wherein a portion of the encapsulant is disposed between the first lower element and the second lower element.

12. An assembly structure, comprising:
   a package structure, comprising:
      a plurality of lower elements disposed side by side;
      a reinforcement structure surrounding the lower elements, and having a top surface; and
      an encapsulant covering the lower elements and the top surface of the reinforcement structure, wherein the encapsulant has a first surface and a second surface opposite to the first surface, and a plurality of electrical connectors of the lower elements are exposed from the first surface of the encapsulant;
   a conductive structure disposed adjacent to the first surface of the encapsulant, and electrically connected to the electrical connectors of the lower elements, wherein the conductive structure includes at least one dielectric layer and at least one circuit layer in contact with the dielectric layer; and
   at least one upper element electrically connected to the conductive structure.

13. The assembly structure of claim 12, wherein the lower element includes a core portion, at least one dielectric layer and at least one circuit layer in contact with the dielectric layer, the at least one dielectric layer and the at least one circuit layer of the lower element are disposed adjacent to a surface of the core portion, and a line width/line space (L/S) of the circuit layer of the lower element is greater than a line width/line space (L/S) of the circuit layer of the conductive structure.

14. The assembly structure of claim 12, wherein the reinforcement structure is electrically isolated from the conductive structure.

15. The assembly structure of claim 12, wherein the conductive structure is attached to the first surface of the encapsulant through an intermediate layer.

16. The assembly structure of claim 15, further comprising at least one upper through via extending through the conductive structure and the encapsulant, and electrically connected to the electrical connectors of the lower elements.

17. The assembly structure of claim 12, wherein the reinforcement structure is a wall structure.

18. The assembly structure of claim 12, wherein the reinforcement structure includes a plurality of wall segments spaced apart from each other.

19. The assembly structure of claim 12, wherein a bottom surface of the reinforcement structure, the second surface of the encapsulant, and a bottom surface of the lower elements are substantially coplanar with each other.

20. The assembly structure of claim 12, wherein a material of the reinforcement structure includes metal, the reinforcement structure has a top surface and a bottom surface, and the encapsulant covers the top surface of the reinforcement structure, and the second surface of the encapsulant is substantially coplanar with the bottom surface of the reinforcement structure.

21. The assembly structure of claim 16, wherein the conductive structure includes at least one inner via, wherein a tapering direction of the inner via of the conductive structure is different from a tapering direction of the upper through via.

22. The assembly structure of claim 12, further comprising a molding compound covering the package structure, wherein a surface of the upper element is exposed from the molding compound.

* * * * *